(12) United States Patent
Brosseau et al.

(10) Patent No.: US 9,215,813 B2
(45) Date of Patent: Dec. 15, 2015

(54) METHOD FOR RECYCLING OF OBSOLETE PRINTED CIRCUIT BOARDS

(75) Inventors: André Brosseau, Montreal (CA); Svitlana Grigorenko, Montreal (CA); Ping Jiang, Danbury, CT (US); Michael B. Korzenski, Danbury, CT (US)

(73) Assignee: Advanced Technology Materials, Inc., Danbury, CT (US)

(*) Notice: Subject to any disclaimer, the term of this patent is extended or adjusted under 35 U.S.C. 154(b) by 355 days.

(21) Appl. No.: 13/641,371

(22) PCT Filed: Apr. 15, 2011

(86) PCT No.: PCT/US2011/032675
§ 371 (c)(1),
(2), (4) Date: Jan. 7, 2013

(87) PCT Pub. No.: WO2011/130622
PCT Pub. Date: Oct. 20, 2011

(65) Prior Publication Data
US 2013/0276284 A1    Oct. 24, 2013

Related U.S. Application Data

(60) Provisional application No. 61/412,628, filed on Nov. 11, 2010, provisional application No. 61/412,390, filed on Nov. 10, 2010, provisional application No. 61/388,643, filed on Oct. 1, 2010, provisional
(Continued)

(51) Int. Cl.
*C22B 5/00* (2006.01)
*H05K 3/22* (2006.01)
(Continued)

(52) U.S. Cl.
CPC ........ *H05K 3/22* (2013.01); *C22B 7/007* (2013.01); *C22B 11/046* (2013.01); *C23F 1/44* (2013.01); *H05K 2203/176* (2013.01);
(Continued)

(58) Field of Classification Search
CPC ........ C22B 7/006; C22B 7/007; C22B 7/008; C22B 11/046; C23F 1/44; H05K 2203/176; H05K 2203/178
See application file for complete search history.

(56) References Cited

U.S. PATENT DOCUMENTS

| 873,583 A | 12/1907 | Nichols |
| 3,399,090 A | 8/1968 | Caropreso et al. |

(Continued)

FOREIGN PATENT DOCUMENTS

| CN | 1070536 A | 3/1993 |
| CN | 1858277 A | 11/2006 |

(Continued)

OTHER PUBLICATIONS

Stennett, A.D.; "Novel rework techniques for electronic assemblies," Proceedings of the Electronic Packaging Technology Conference, EPTC 1998 IEEE, pp. 196-201.
(Continued)

*Primary Examiner* — Alexander P Taousakis
(74) *Attorney, Agent, or Firm* — Tristan A. Fuierer; Moore & Van Allen, PLLC; Maggie Chappuis

(57) ABSTRACT

Processes for recycling printed wire boards using environmentally-friendly compositions, wherein electronic components, precious metals and base metals may be collected for reuse and recycling.

26 Claims, 3 Drawing Sheets

Related U.S. Application Data application No. 61/385,586, filed on Sep. 23, 2010, provisional application No. 61/376,549, filed on Aug. 24, 2010, provisional application No. 61/368,360, filed on Jul. 28, 2010, provisional application No. 61/362,118, filed on Jul. 7, 2010, provisional application No. 61/324,390, filed on Apr. 15, 2010.

(51) Int. Cl.
    *C22B 7/00* (2006.01)
    *C22B 3/00* (2006.01)
    *C23F 1/44* (2006.01)

(52) U.S. Cl.
    CPC ......... *H05K 2203/178* (2013.01); *Y02W 30/54* (2015.05); *Y10T 29/49815* (2015.01)

(56) References Cited

U.S. PATENT DOCUMENTS

| | | | |
|---|---|---|---|
| 3,644,150 A | 2/1972 | Oomen et al. | |
| 3,935,125 A | 1/1976 | Jacob | |
| 3,947,351 A | 3/1976 | Asawa et al. | |
| 3,957,505 A | 5/1976 | Homick et al. | |
| 4,070,182 A | 1/1978 | Genik-Sas-Berezowsky et al. | |
| 4,261,738 A | 4/1981 | Valentine et al. | |
| 4,269,622 A | 5/1981 | Kerley, Jr. | |
| 4,369,061 A | 1/1983 | Kerley, Jr. | |
| 4,374,744 A | 2/1983 | Kawanabe et al. | |
| 4,426,225 A | 1/1984 | Ida et al. | |
| 4,426,251 A | 1/1984 | Ida et al. | |
| 4,437,928 A | 3/1984 | Wong | |
| 4,557,759 A * | 12/1985 | McGrew et al. | 75/712 |
| 4,654,078 A | 3/1987 | Perez et al. | |
| 4,668,289 A | 5/1987 | Langer et al. | |
| 4,678,552 A * | 7/1987 | Chen | 205/717 |
| 4,713,144 A | 12/1987 | Schiller | |
| 4,813,589 A * | 3/1989 | Palmer et al. | 228/119 |
| 4,913,730 A | 4/1990 | Deschenes et al. | |
| 4,921,571 A | 5/1990 | Kukanskis et al. | |
| 4,944,851 A | 7/1990 | Cordani et al. | |
| 4,957,653 A | 9/1990 | Cordani | |
| 5,017,267 A | 5/1991 | Cordani | |
| 5,035,749 A | 7/1991 | Haruta et al. | |
| 5,137,700 A | 8/1992 | Sloan | |
| 5,190,578 A | 3/1993 | Feldman | |
| 5,217,171 A | 6/1993 | Feldman | |
| 5,244,539 A | 9/1993 | McGrath et al. | |
| 5,279,803 A | 1/1994 | Clough | |
| 5,328,669 A * | 7/1994 | Han et al. | 423/32 |
| 5,389,124 A | 2/1995 | Nakao | |
| 5,402,563 A | 4/1995 | Satoh et al. | |
| 5,512,201 A * | 4/1996 | Singh et al. | 252/79.4 |
| 5,520,794 A | 5/1996 | Gernon | |
| 5,542,957 A * | 8/1996 | Han et al. | 75/732 |
| 5,552,579 A | 9/1996 | Krueger | |
| 5,630,554 A | 5/1997 | Izumikawa et al. | |
| 5,683,040 A | 11/1997 | Jakob et al. | |
| 5,715,592 A | 2/1998 | Mori et al. | |
| 5,755,950 A | 5/1998 | Bell | |
| 5,928,529 A | 7/1999 | Campbell | |
| 5,980,841 A | 11/1999 | Yamamoto | |
| 5,989,449 A | 11/1999 | Campbell | |
| 6,227,434 B1 | 5/2001 | Bassi et al. | |
| 6,258,294 B1 | 7/2001 | Johnson, II et al. | |
| 6,271,048 B1 | 8/2001 | Reilich et al. | |
| 6,455,018 B1 | 9/2002 | Cuif | |
| 6,464,531 B2 * | 10/2002 | Eckert et al. | 439/465 |
| 6,638,363 B2 | 10/2003 | Erdmann | |
| 6,641,712 B1 | 11/2003 | Gibson et al. | |
| 6,675,454 B1 | 1/2004 | Marschner | |
| 6,716,290 B1 | 4/2004 | Rosser et al. | |
| 6,986,192 B2 | 1/2006 | Fitch | |
| 7,067,090 B2 | 6/2006 | Han et al. | |
| 7,166,145 B1 * | 1/2007 | Han | 75/744 |
| 7,285,229 B2 | 10/2007 | Kuriyama et al. | |
| 7,473,406 B2 | 1/2009 | Jasra et al. | |
| 7,513,931 B2 | 4/2009 | Thomas | |
| 7,703,197 B2 | 4/2010 | Moltion | |
| 7,740,684 B2 | 6/2010 | Xu | |
| 7,786,401 B2 | 8/2010 | Valerio | |
| 7,902,262 B2 | 3/2011 | Armstrong et al. | |
| 7,960,328 B2 * | 6/2011 | Visintin et al. | 510/175 |
| 7,972,413 B2 | 7/2011 | Xia | |
| 7,998,914 B2 * | 8/2011 | Shimada et al. | 510/175 |
| 8,062,429 B2 * | 11/2011 | Lee | 134/1.3 |
| 8,257,671 B2 * | 9/2012 | Kuwano et al. | 423/24 |
| 8,486,281 B2 | 7/2013 | Feng et al. | |
| 2001/0030251 A1 | 10/2001 | Ueno et al. | |
| 2003/0132416 A1 * | 7/2003 | Boguslavsky et al. | 252/2 |
| 2004/0081602 A1 | 4/2004 | Han et al. | |
| 2004/0181923 A1 | 9/2004 | Dills | |
| 2004/0219082 A1 | 11/2004 | Matjie et al. | |
| 2007/0054106 A1 | 3/2007 | Armstrong et al. | |
| 2007/0169330 A1 * | 7/2007 | Wu | 29/403.3 |
| 2008/0121621 A1 | 5/2008 | Stockum et al. | |
| 2008/0206960 A1 | 8/2008 | Dang et al. | |
| 2009/0272227 A1 * | 11/2009 | Creasey et al. | 75/300 |
| 2010/0071507 A1 | 3/2010 | Lee et al. | |
| 2010/0181205 A1 * | 7/2010 | Thpmas | 205/568 |
| 2010/0187732 A1 | 7/2010 | Inuma | |
| 2011/0147501 A1 | 6/2011 | Valerio | |
| 2011/0220554 A1 * | 9/2011 | Thomas et al. | 209/3.1 |
| 2011/0230689 A1 | 9/2011 | Scheirs | |
| 2012/0000999 A1 | 1/2012 | Koslow | |
| 2012/0031566 A1 * | 2/2012 | Meloni | 156/752 |
| 2012/0292201 A1 | 11/2012 | Hsu | |
| 2013/0174694 A1 * | 7/2013 | Xu | 75/10.13 |
| 2013/0276284 A1 | 10/2013 | Brosseau et al. | |
| 2013/0326850 A1 * | 12/2013 | Xu | 29/403.3 |
| 2014/0243249 A1 | 8/2014 | Hsu | |

FOREIGN PATENT DOCUMENTS

| | | |
|---|---|---|
| CN | 101270411 A | 9/2008 |
| CN | 101623698 A | 1/2010 |
| DE | 19715319 A1 | 10/1998 |
| EP | 1457577 A1 | 9/2004 |
| EP | 1811821 A1 | 7/2007 |
| GB | 873583 A | 7/1961 |
| JP | H09013189 A | 1/1997 |
| JP | 10183264 A | 7/1997 |
| JP | 09316549 A | 12/1997 |
| JP | 10314713 A | 12/1998 |
| JP | H1136020 A | 2/1999 |
| JP | 2003003218 A | 1/2003 |
| JP | 2003508624 A | 3/2003 |
| JP | 2005154892 A | 6/2005 |
| JP | 2007092138 A | 4/2007 |
| JP | 2010168625 A | 8/2010 |
| KR | 0145346 B1 | 8/1998 |
| KR | 20020022856 A | 3/2002 |
| KR | 20030006792 A | 1/2003 |
| WO | 8706274 A1 | 10/1987 |
| WO | 0043574 A1 | 7/2000 |
| WO | 2006013568 A2 | 2/2006 |

OTHER PUBLICATIONS

International Search Report and Written Opinion, Jul. 22, 2011.
Shaigan, N. et al.; "A highly stabilized-inhibited nitric acid/ferric nitrate-based solder stripping solution," Journal of Applied Electrochemistry, 2006, pp. 1043-1049, vol. 36.
Kerr, Charlie; "Sustainable technologies for the regeneration of acidic tin stripping solutions used in PCB fabrication," Circuit World, 2004, 51-58, vol. 30/3, Abstract Only.
Stennett, A.D., et al.; "Novel techniques for electronic component removal," Soldering & Surface Mount Technology, 1999, 7-11, 11/2, Abstract Only.
Mecucci, Andrea, et al.; "Leaching and electrochemical recovery of copper, lead and tin from scrap printed circuit boards," Journal of Chemical Technology and Biotechnology, 2002, pp. 449-457, vol. 77.

(56) References Cited

OTHER PUBLICATIONS

Gernon, Michael D., et al.; "Environmental benefits of methanesulfonic acid: Comparative properties and advantages," Green Chemistry, 1999, pp. 127-140.

Antonijevic, M.M., et al.; "Copper Corrosion Inhibitors. A review," International Journal of Electrochemical Science, 2008, pp. 1-28, vol. 3.

Gladyshev, S.V., et al.; Russion Journal of General Chemistry, 2000, vol. 70, p. 1429.

Leighton, T.G., The Acoustic Bubble, 1994, Academic Press, pp. 613, Review of Front Cover Only, As This Is A Book.

Suslick, K.S., Kirk-Othmer Encyclopedia of Chemical Technology, 4th Edition, 1998, J. Wiley & Sons, New York, pp. 517-541, vol. 26.

Henglein, Arnim, "Chemical effects of continuous and pulsed ultrasound in aqueous solutions," Ultrasonics Sonochemistry, 1995, pp. 115-121, vol. 2.

Moleux, P.G., A case study and update using diffusion dialysis to purify acid in a plant that fabricates PCBs, Proc. 89th Annual Meeting, Air and Waste Management Association, 1996.

Coombs, Clyde, Printed Circuits Handbook, 2007, McGraw-Hill Professional, 6th Edition, pp. 1000, Review of Front Cover Only, As This Is A Book.

Angelidis, T.N., et al.; "Selective gold dissolution from a roasted auriferous pyrite-arsenopyrite concentrate," Hydrometallurgy, 1995, pp. 75-88, vol. 37.

Gammons, Christopher H., et al.; "The disproportionation of gold (I) chloride complexes at 25 to 200 degrees Celsius," Geochimica et Cosmochimica Acta, 1997, pp. 1971-1983, vol. 61.

Syed, S., "A green technology for recovery of gold from non-metallic secondary sources," Hydrometallurgy, 2006, pp. 48-53, vol. 82.

Sheng, Peter P., et al.; "Recovery of gold from computer circuit board scrap using aqua regia," Waste Manage Res., 2007, pp. 380-383, vol. 25.

Quinet, P. et al.; "Recovery of precious metals from electronic scrap by hydrometallurgical processing routes," Minerals & Metallurgical Processing, 2005, pp. 17-22, vol. 22, Abstract Only.

Scott, K. et al.; "Elecrochemical recycling of tin, lead and copper from stripping solution in the manufacture of circuit boards," Resources, Conservation and Recycling, 1997, pp. 43-55, vol. 20.

Korean Office Action dated Jul. 28, 2015.

Umeda, H., et al; "Recovery and Concentration of Precious Metals from Strong Acidic Wastewater," Materials Transactions, 2011, pp. 1462-1470, vol. 52.

IBM; Lawerence, JG; "Surface-Mounted Component Desoldering Tool," ip.com; 1986, pp. 1-3.

Brandon, N.P.; "Metal Recovery From Electronic Scrap by Leaching and Electrowinning," Electrochemical Society Meeting, Sep. 2001, pp. 1-17.

Korean Office Action, Apr. 17, 2015.

Chinese Office Action, Apr. 30, 2015.

"Reviewing the Operation of Gold Electrowinning Cells," RenoCell Technical Bulletin, RRII-110010-0, Renovare International, Inc., Jun. 28, 2011, pp. 1-33.

Altmayer, F., et al.; "The Effect of Barrel Design on Drag-out," Plating and Finishing, Feb. 2002, pp. 32-37.

Jiang, P., et al.; "Improving the end-of-life for electronic materials via sustainable recycling methods," Procedia Environmental Sciences, vol. 16, pp. 485-490, 2012.

European Search Report, Jun. 5, 2015.

Japanese Office Action, Sep. 8, 2015.

\* cited by examiner

METHOD FOR RECYCLING OF OBSOLETE PRINTED CIRCUIT BOARDS

CROSS-REFERENCE TO RELATED APPLICATIONS

This application is filed under the provisions of 35 U.S.C. X371 and claims the priority of International Patent Application No. PCT/US2011/032675 filed on 15 Apr. 2011 in the name of André BROSSEAU et al. and entitled "METHOD FOR RECYCLING OF OBSOLETE PRINTED CIRCUIT BOARDS CROSS REFERENCE TO RELATED APPLICATIONS" which claims priority to U.S. Provisional Patent Application No. 61/324,390 filed Apr. 15, 2010 in the name of Svitlana Grigorenko and André Brosseau entitled "Method of Selective Recovery of Precious Metals by the Use of Ultrasonic Irradiation," to U.S. Provisional Patent Application No. 61/376,549 filed Aug. 24, 2010 in the name of Svitlana Grigorenko and André Brosseau entitled "Methods of Removal of Components on Populated Circuit Boards by Means of Selective Recovery of Tin, Lead and/or Lead-Tin Solder Intensified by the Application of Ultrasound," to U.S. Provisional Patent Application No. 61/412,390 filed Nov. 10, 2010 in the name of André Brosseau and Svitlana Grigorenko entitled "Methods for Recycling of Obsolete Printed Circuit Boards," to U.S. Provisional Patent Application No. 61/362,118 filed Jul. 7, 2010 in the name of Michael B. Korzenski and Ping Jiang entitled "Processes for Reclaiming Precious Metals and Copper from Printed Wire Boards," to U.S. Provisional Patent Application No. 61/368,360 filed Jul. 28, 2010 in the name of Michael B. Korzenski and Ping Jiang entitled "Processes for Reclaiming Precious Metals and Copper from Printed Wire Boards," to U.S. Provisional Patent Application No. 61/385,586 filed Sep. 23, 2010 in the name of Michael B. Korzenski and Ping Jiang entitled "Processes for Reclaiming Precious Metals and Copper from Printed Wire Boards," to U.S. Provisional Patent Application No. 61/388,643 filed Oct. 1, 2010 in the name of Ping Jiang and Michael B. Korzenski entitled "Formulation and Method for Leaching Gold from Material," and to U.S. Provisional Patent Application No. 61/412,628 filed Nov. 11, 2010 in the name of André Brosseau, Svitlana Grigorenko, Ping Jiang and Michael B. Korzenski entitled "Method for Recycling of Printed Circuit Boards," each of which is incorporated by reference herein in their entirety.

FIELD

The present invention relates generally to processes for recycling printed wire boards to separate materials including, but not limited to, precious metals, base metals, solder metals, and working integrated circuits.

DESCRIPTION OF THE RELATED ART

Disposal of used electronic equipment including obsolete or damaged computers, computer monitors, television receivers, cellular telephones, and similar products, is increasing at a rapid rate. It is recognized that there are significant hazards to living things and to the environment generally when electronic equipment is dumped in landfills. Equally, it is understood that improper disassembly poses appreciable risks to the health and safety of people performing disassembly manually.

Printed wire boards (PWBs) are a common element of many electronic systems. PWBs are typically manufactured by laminating dry film on clean copper foil, which is supported on a fiberglass plate matrix. The film is exposed with a film negative of the circuit board design, and an etcher is used to remove unmasked copper foil from the plate. Solder is then applied over the unetched copper on the board. Depending upon the use and design of the particular PWB, various other metals may be used in the manufacturing process, including lead, tin, nickel, iron, zinc, aluminum, silver, gold, platinum, palladium, and mercury. The PWBs include many additional components, for example, transistors, capacitors, heat sinks, integrated circuits (IC's), resistors, integrated switches, processors, etc.

PWBs are potentially a difficult waste material to process since they generally have little usefulness once they are removed from the electrical system in which they were installed. In addition, they typically consist of materials that classify them as a hazardous or "special" waste stream. They must be segregated and handled separately from other non-hazardous solid waste streams. PWBs that are handled as waste materials must be processed using any one of several available disposal options. Not only are these options expensive, they require a significant amount of effort and handling by the generator. Furthermore, since some of these disposal options do not include destruction of the waste circuit boards, the generator also retains much of the liability associated with improper handling or disposal.

Different methods have been suggested to try to combat the waste of raw materials and environmental pollution caused by the ever increasing load of scrap electronic waste. To date, methods requiring a high energy demand are needed to separate the materials so that they can be recycled. Mechanical and hydrometallurgical methods have been the traditional methods of recycling of waste PWBs, which comprise grinding of the whole waste, followed by attempts to separate and concentrate different material streams. Disadvantageously, when PWBs are ground, only the plastic fraction can be effectively liberated from metals and toxic gases are evolved. Accordingly, mechanical methods do not result in high recovery rates, especially for precious metals. In hydrometallurgical methods, large amounts of chemicals are used, generating huge quantities of waste acids and sludge, which have to be disposed as hazardous waste. Furthermore, the overall processes of recycling of various metals by chemical processes are very long and complicated. Thermal methods, including pyrometallurgical processing of waste PWBs, result in the emission of hazardous chemicals to the atmosphere and water as the result of thermal degradation of epoxy (formation of dioxins and furans) and volatilization of metals (including Pb, Sb, As and Ga). Thermal methods are further characterized by high energy consumption, and the necessity to use expensive exhaust gas purification systems and corrosion resistance equipment.

Further, disadvantageously, the present methods of extracting precious metals (e.g., gold) from materials include using toxic and/or expensive chemicals (i.e., lixiviants) to leach the gold from the material. One of the oldest commercial processes for dissolving gold is the so-called "cyanide process" whereby the cyanide ion forms such a stable complex with gold. The effectiveness of the cyanide process has led to its commercial usage for both extraction of gold from its ores and for the reclamation of gold from gold coated scrap parts. Generally, a potassium cyanide solution is used in the "cyanide process." Disadvantageously, this solution is very toxic and disposing of spent cyanide solution has become a significant and increasing waste disposal and pollution abatement control problem. Gold has also been dissolved using a mixture of hydrochloric acid and nitric acid, known as "aqua regia," in order to obtain the complex chlorauric acid, HAuCl$_4$. Aqua regia, however, is extremely corrosive, yields toxic fumes, and does not have any selectivity for precious metals.

Printed circuit boards without any components and solder (i.e., bare boards) represent a material that is much easier to recycle than populated circuit boards with mounted components, since bare boards by themselves consist only of copper and fiberglass foils glued by epoxy with some gold/nickel/copper plating on their surface. As bare board represents 65-70% by weight of an average populated printed circuit board, removal of components from the board leads to formation of an easily-recyclable material fraction, which represents 65-70% of the total volume. This approach is more advantageous compared to common practice of size reduction applied to the whole incoming material volume. Moreover, once removed from the boards, recovered components may be sorted and sold by type, such as components containing tantalum or components that can be reused, thereby generating multiple product streams with a higher retail value than just a mix of components.

Thus, a need exists for a method of recycling printed wire board components and other materials comprising gold or other precious metals and for recovering the gold or other precious metals therefrom that overcome or minimize the above-referenced problems.

SUMMARY

The present invention relates generally to processes for recycling printed wire boards to separate materials for reuse and/or recovery. More particularly, the present invention relates generally to processes for recycling PWBs to recover precious metals, base metals, working components, and tantalum metals.

In one aspect, a method of separating a printed wire board component from a printed wire board is described. Said method comprises contacting a first composition with the printed wire board to selectively remove the printed wire board component from said printed wire board.

In another aspect, a first composition that selectively removes solder, (e.g., lead and/or tin-containing materials) relative to precious metals, tantalum-containing metals, and/or base metals is described. The first composition comprises, consists of, or consists essentially of at least one oxidizing agent, optionally at least one at least one lead and/or tin complexing agent, optionally at least one organic solvent, optionally at least one passivating agent, and optionally a sulfamate ion.

In still another aspect, a method of removing precious metals from the surface is described, wherein said precious metals are undercut from the surface. The method comprises contacting said surface with a second composition, to selectively remove base metals relative to the precious metals present on said surface.

In another aspect, a second composition that selectively removes base metals such as copper and/or nickel containing materials relative to precious metals (e.g., gold) is described, said second composition comprising, consisting of, or consisting essentially at least one oxidizing agent, optionally at least one base metal complexing agent, optionally at least one organic solvent, and optionally at least one passivating agent.

In still another aspect, a method of recovering precious metals, e.g., gold, from precious metal-containing materials is described, wherein said method comprises introducing the precious metal-containing materials to a leaching composition comprising triiodide, and optionally introducing ultrasonic cavitation thereto.

In yet another aspect, a bare board can be processed to liberate the fiberglass-epoxy layer from the copper, wherein the bare board can be processed by degrading the epoxy, which liberates the copper sheet from the fiberglass.

In another aspect, a method of processing a printed wire board (PWB) is described, said method comprising:
(a) separating at least one component from the PWB; and
(b) removing at least one metal, the at least one component, or both from the PWB.

In another aspect, a method of removing lead and/or tin-containing materials from a solid material is described, wherein said method includes contacting a first composition with the solid material having the lead and/or tin-containing materials thereon or therein, under sufficient contacting conditions to remove the lead and/or tin-containing materials from the solid material. The solid material includes, but is not limited to, microelectronic devices, metals, plastics, fabrics, fibers, soils, ores, wood, paper, glass, leather and other animal hides, cement, concrete, bricks, drywall, asphalt, keratin-containing substances such as hair and nails, rubber, latex, and combinations thereof.

In a further aspect, a method of removing copper and/or nickel-containing materials from a solid material is described, wherein said method includes contacting a second composition with the solid material having the copper and/or nickel-containing materials thereon or therein, under sufficient contacting conditions to remove the copper and/or nickel-containing materials from the solid material. The solid material includes, but is not limited to, microelectronic devices, metals, plastics, fabrics, fibers, soils, ores, wood, paper, glass, leather and other animal hides, cement, concrete, bricks, drywall, asphalt, keratin-containing substances such as hair and nails, rubber, latex, and combinations thereof.

Other aspects, features and advantages will be more fully apparent from the ensuing disclosure and appended claims.

DETAILED DESCRIPTION AND PREFERRED EMBODIMENTS THEREOF

Figure 1:
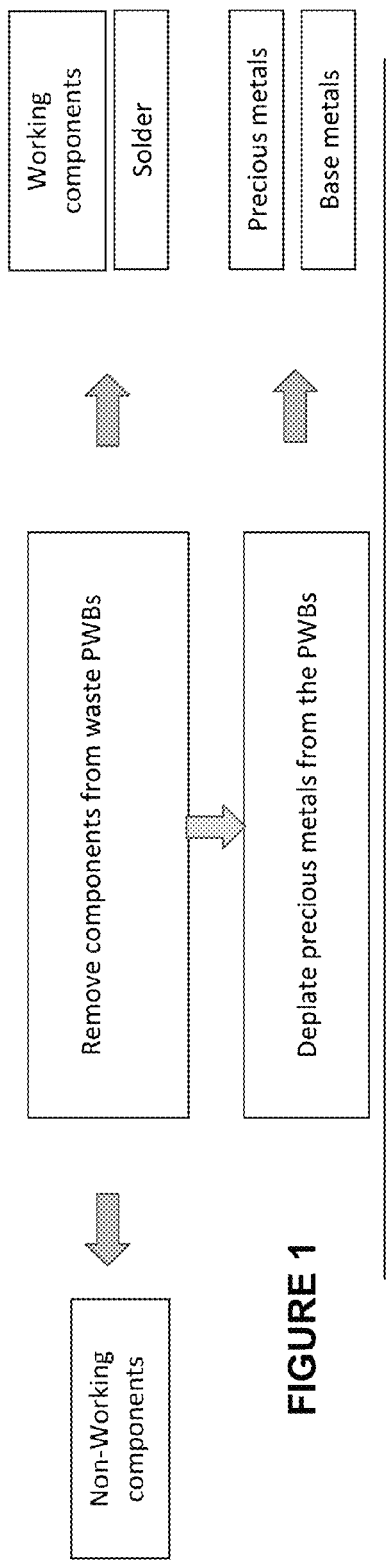
FIG. 1 illustrates a first embodiment of the method of recycling printed wire boards.

The present invention relates generally to processes for recycling printed wire boards to separate materials for reuse and/or recovery. More particularly, the present invention relates generally to processes for recycling PWBs to recover precious metals, base metals, working components, and tantalum metals. Advantageously, the processes described herein are more environmentally friendly and require less energy than the methods of the prior art.

As introduced in the background section, the traditional methods of recycling of waste PWBs result in environmental contamination, high cost expenditure and low efficiency. In contrast, the methods described herein are based on a differential approach to the recycling of materials, wherein the various parts of the waste PWBs are separated based on appearance and physical and chemical properties. The methods described herein can use sonochemistry to increase the rates of chemical leaching and mechanical disaggregation, making possible high recovery rates using low amounts of chemicals. Alternatively, the methods described herein do not require sonochemistry to effectively and efficiently recycle the waste PWBs.

In general, a process of removing at least one recyclable material from a printed wire board (PWB) is described, said method comprising at least one of (a), (b), (c), or any combination thereof:
(a) releasing a component from the PWB;
(b) recovering a precious metal from the PWB and/or PWB component;
(c) recovering a base metal from the PWB.

For the purposes of the present disclosure, "electronic waste" or "e-waste" corresponds to computers, computer monitors, television receivers, electronic pads, cellular telephones, video cameras, digital cameras, DVD players, video game consoles, facsimile machines, copiers, MP3 players, and similar products that have reached the end of their useful life or otherwise have been disposed of Electronic waste or e-waste includes the components contained within these well known items such as printed wire boards and the components contained thereon (e.g., transistors, capacitors, heat sinks, IC's, resistors, integrated switches, chips and processors).

For the purposes of the general disclosure, the bare board is described as comprising fiberglass, epoxy and copper foil. As will be appreciated by the skilled artisan, "fiberglass" is a glass-reinforced plastic or a glass fiber reinforced plastic and will correspond to any material that comprises plastic and glass.

As used herein, "precious metals" include the metals gold, silver, platinum, palladium, and alloys comprising same.

As used herein, "base metals" corresponds to iron, nickel, zinc, copper, aluminum, tungsten, molybdenum, tantalum, magnesium, cobalt, bismuth, cadmium, titanium, zirconium, antimony, manganese, beryllium, chromium, germanium, vanadium, gallium, hafnium, indium, niobium, rhenium, thallium, alloys comprising same, and combinations thereof.

As used herein, "copper" corresponds to Cu(0) metal as well as alloys comprising Cu(0).

"Substantially devoid" is defined herein as less than 2 wt. %, preferably less than 1 wt. %, more preferably less than 0.5 wt. %, and most preferably less than 0.1 wt. %. "Devoid" corresponds to 0 wt. %.

As used herein, "about" is intended to correspond to ±5% of the stated value.

As used herein, "selectively removes solder relative to precious metals, base metals and/or tantalum-containing metals" or "selectively removes lead and/or tin-containing materials relative to precious metals, base metals and/or tantalum-containing metals" corresponds to a part per million (ppm) removal selectivity of about 2:1 to about 1,000,000:1, preferably about 100:1 to about 1,000,000:1, more preferably about 1000:1 to about 1,000,000:1, and most preferably about 10,000:1 to about 1,000,000:1. In other words, when 2 (or upwards of 1,000,000) ppm of lead and/or tin-containing materials are removed, no more than 1 ppm of precious metals, base metals and/or tantalum-containing metals are removed.

As used herein, "selectively dissolves base metal relative to precious metal" or "selectively dissolves base metal relative to the gold" corresponds to a part per million (ppm) removal selectivity of about 2:1 to about 1,000,000:1, preferably about 100:1 to about 1,000,000:1, more preferably about 1000:1 to about 1,000,000:1, and most preferably about 10,000:1 to about 1,000,000:1. In other words, when 2 (or upwards of 1,000,000) ppm of base metals are removed, no more than 1 ppm of gold is removed.

As defined herein, "complexing agent" includes those compounds that are understood by one skilled in the art to be complexing agents, chelating agents, sequestering agents, and combinations thereof. Complexing agents will chemically combine with or physically associate with the metal atom and/or metal ion to be removed using the compositions described herein.

For the purposes of the present description, "printed wire boards" and "printed circuit boards" are synonymous and may be used interchangeably.

As used herein, the term "separation" corresponds to the complete removal of the component(s) from the PWB or the partial separation of the component(s) from the PWB, wherein the partial separation of the component from the PWB corresponds to the weakening of the solder holding the component(s) to the PWB and the remainder of the separation may be carried out by another method.

As used herein, "to remove" solder relative to precious metals, base metals and/or tantalum-containing metals means that solder metal or ions are substantially dissolved or otherwise solubilized in the removal composition, preferably dissolved, while the precious metals, base metals and/or tantalum-containing metals are not substantially dissolved or otherwise solubilized. Analogously, "to remove" base metals relative to the precious metals means that base metals or ions are substantially dissolved or otherwise solubilized in the removal composition, preferably dissolved, while the precious metals are not substantially dissolved or otherwise solubilized. Further, "to remove" precious metals from precious metal containing materials means that the precious metal is substantially dissolved or otherwise solubilized in the leaching composition, preferably dissolved, while base metals and/or tantalum-containing metals are not substantially dissolved or otherwise solubilized. "Substantially dissolved" is defined herein more than 95 wt. % of the material originally present is dissolved or otherwise solubilized, preferably more than 98 wt. %, more preferably more than 99 wt. %, and most preferably more than 99.9 wt. %. "Not substantially dissolved" is defined herein less than 5 wt. % of the material originally present is dissolved or otherwise solubilized, preferably less than 2 wt. %, more preferably less than 1 wt. %, and most preferably less than 0.1 wt. %.

As used herein, the term "leaches" corresponds to the complete removal or extraction of the gold or other precious metals from the PWB and/or PWB component into the leaching composition or the partial removal or extraction of the gold or other precious metals from the PWB and/or PWB component into the leaching composition. The gold or other precious metal is dissolved or otherwise solubilized in the leaching composition, preferably dissolved.

As defined herein, "crushing" the PWB and/or PWB components corresponds to any method that substantially exposes the gold and other precious metals of the PWB and/or PWB component to the leaching composition, e.g., cracking, pulverizing or shredding the PWB and/or PWB component. Preferably, the PWB components are cracked, thereby minimizing the amount of gold or other precious metals lost as a result of the pulverizing or shredding. Precious metals can be lost if scrap is pulverized wherein gold dust adheres to the separated stream and is lost in the magnetic fraction. Accordingly, crushing is further defined as a process whereby no more than 10% of the gold or other precious metals are lost to processes such as pulverizing or shredding, preferably no more than 5%, even more preferably no more than 2%. Moreover, crushing the e-waste minimizes the risk to human health by minimizing the release of dusts containing hazardous metals and brominated flame retardants.

As defined herein, "agitation means" include, but are not limited to, physical agitation such as mixing, recirculation, turbulence, vibrations, sonication, and combinations thereof.

It is well understood to the skilled artisan that "iodine" corresponds to the $I_2$ molecule while "iodide" ($I^-$) is an anion and is provided as a salt. Iodide salts include, but are not limited to, lithium iodide, sodium iodide, potassium iodide, ammonium iodide, calcium iodide, magnesium iodide, and tetraalkylammonium iodides, wherein the alkyl groups may be the same as or different from one another and are selected from the group consisting of straight-chained $C_1$-$C_6$ alkyls (e.g., methyl, ethyl, propyl, butyl, pentyl, hexyl) and branched $C_1$-$C_6$ alkyls.

Compositions may be embodied in a wide variety of specific formulations, as hereinafter more fully described. In all such compositions, wherein specific constituents of the composition are discussed in reference to weight percentage ranges including a zero lower limit, it will be understood that such constituents may be present or absent in various specific embodiments of the composition, and that in instances where such constituents are present, they may be present at concentrations as low as 0.001 weight percent, based on the total weight of the composition in which such constituents are employed.

Method of Selectively Removing Solder

Components are typically attached to the surface of PWBs with a lead, tin or lead-tin solder, which usually comes in combinations of 70Sn/30Pb, 60Sn/40Pb or 63Sn/37Pb. In certain applications Ag—Sn solder is used. Currently, the desoldering of PWBs for component removal involves heating the solder to melting temperature, whereby the liberated components separate from the PWB and the liquid solder is collected. This method applied for recycling PWBs has two main disadvantages: (i) as lead and tin are low-volatile metals, such heating and melting will create a high level of polluting emissions to the ambient air; and (ii) the heat will damage the components making them unacceptable for re-use.

In a first aspect, a method of separating a printed wire board component from a printed wire board is described. Broadly, said method comprises contacting a first composition with the printed wire board to selectively remove the printed wire board component from said printed wire board. The printed wire board component may be attached to the printed wire board using solder or some other affixing means.

In one embodiment, a method of removing solder from a surface is described, wherein said method comprises contacting said solder with a first composition to selectively remove the solder relative to metals that are simultaneously present on said surface. In another embodiment, a method of removing solder from a surface is described, wherein said method comprises contacting said solder with a first composition in a vessel, and optionally producing ultrasonic cavitation or other agitation means in said vessel, to selectively remove the solder relative to metals that are simultaneously present on said surface. Preferably, the solder comprises lead, tin, or a combination of lead and tin. Preferably, the metals comprise precious metals, tantalum-containing metals, base metals, or any combination of precious metals, tantalum-containing metals, and base metals. Preferably, the surface includes a PWB. Accordingly, in an embodiment, a method of removing lead and/or tin-containing solder from a PWB is described, wherein said method comprises contacting said solder with a first composition in a vessel, and optionally producing ultrasonic cavitation or other agitation means in said vessel, to selectively remove the solder relative to precious metals, tantalum-containing metals, and/or base metals that are simultaneously present on said PWB. In another embodiment, a method of removing lead and/or tin-containing solder from a PWB is described, wherein said method comprises contacting said solder with a first composition in a vessel, and producing ultrasonic cavitation in said vessel, to selectively remove the solder relative to precious metals, tantalum-containing metals, and/or base metals that are simultaneously present on said PWB. In still another embodiment, a method of removing lead and/or tin-containing solder from a PWB is described, wherein said method comprises contacting said solder with a first composition in a vessel, to selectively remove the solder relative to precious metals, tantalum-containing metals, and/or base metals that are simultaneously present on said PWB, wherein no ultrasonics are used in the process of removing said solder from the PWB.

It should be appreciated by the skilled artisan that the solder attaches "components" such as transistors, capacitors, resistors, heat sinks, integrated circuits, integrated switches, processors, chips, etc. to the PWB. Advantageously, new surfaces (i.e., e-waste PWBs) that require the removal of solder can be then added to the first composition and the process of removing the solder to separate the components from the surface can be repeated until the first composition is saturated with lead and/or tin metals. With the removal of the solder, the components are released and said components may be separated using an optical system into those that are reusable and can be resold and those that can be further processed for disposal, reclamation of useful materials, etc. The composition used to remove the solder, which includes lead and/or tin may undergo electrowinning to reclaim pure lead and/or tin and/or alternatively can be processed using diffusion dialysis technology to concentrate the metal ions.

In removal application when no ultrasonics are produced, the first composition is contacted in any suitable manner to the PWB, e.g., by spraying the first composition on the PWB, by dipping (in a volume of the first composition) of the PWB, by contacting the PWB with another material, e.g., a pad, or fibrous sorbent applicator element, that has the first composition absorbed thereon, by contacting the PWB with a recirculating composition, or by any other suitable means, manner or technique, by which the first composition is brought into contact with the material(s) to be removed.

In removal application when ultrasound irradiation is produced, the first composition is contacted to the PWB in a preferably closed vessel wherein ultrasonic irradiation of the first composition can be applied to create intensive cavitation. The frequency of ultrasonic irradiation, the input power and the ultrasonic amplitude should be chosen in such a way that intensive cavitation is created in the given volume of irradiated composition. To obtain a good acceleration of solder removal, high-powered ultrasound at low frequencies such as 20-40 kHz are preferred as being responsible for the effects of mechanical disaggregation. The ultrasound-assisted solder removal process can be carried out in any embodiment providing access of ultrasonic irradiation to the composition with immersed PWBs, whereby intensive cavitation is created in the volume of composition. For example, the ultrasonic energy can be delivered by an ultrasonic horn, which is inserted in a preferably closed vessel, containing the chemical solution (e.g., by UIP1000hd horn with operational frequency of 20 kHz by Hielscher Ultrasonics GmbH, which was used with 1 liter of solution). In this case, however, the PWB components may not be affected equally because of the different distance from the horn. The solder removal process should take place, therefore, either in a small volume, irradiated by the single ultrasonic horn, making sure that intensive cavitation is created in the whole volume, or in large volumes, irradiated by several ultrasonic horns, providing near-equal cavitation intensity in all parts of the closed vessel. Alternatively, an ultrasonic bath with vibrating bottom and/or ultrasonic transducers mounted on the walls can be used to provide equal intensity of ultrasound in the volume of composition (e.g., a Sonochemical Reaction Vessel SRV-160 by Advanced Sonics, LLC; SRV-160 is a 5-gallon US bath driven by 2000 W of ultrasonic power at 20 kHz). In that case, attention should be paid to provide sufficient ultrasonic power, since most off-the-shelf ultrasonic baths manufactured for cleaning applications combine high frequency and low power. There is also an option to create a special configuration of a flat US horn (e.g., as designed by Sonics and Materials Inc.), which enables treatment of flat items like PWBs. Advantageously, the boards can be conveyed on a continuous line through the flat sonotrode (similar to ultrasonic wire cleaning systems such as for example, DRS2000, manufactured by Hielscher Ultrasonics GmbH. As the intensity of ultrasound is known to increase with a rise in pressure, better sonication results can be achieved if light pressure is generated over the composition surface in the closed vessel. Although not wishing to be bound by theory, it is thought that chemical reactions are accelerated by acoustic cavitation by means of formation of radicals which participate in redox reactions with the solutes, which dramatically accelerates chemical leaching of tin, lead and/or tin/lead alloy metals. Acoustic cavitation is also responsible for the creation of special mechanical effects of high-speed jets, shear forces and shock waves on the surfaces of contact, thereby speeding up the mass transfer and mechanical disaggregation without any mechanical or thermal damage, which accelerates the separation of mounted components from the surface of PWBs.

In use of the compositions described herein for removing lead and/or tin-containing materials from PWB's having same thereon, the first composition typically is contacted with the surface for a time of from about 5 sec to about 180 minutes, preferably about 1 min to 60 min, and most preferably about 5 minutes to about 45 minutes at temperature in a range of from about 20° C. to about 85° C., preferably in a range from about 20° C. to about 40° C. Such contacting times and temperatures are illustrative, and any other suitable time and temperature conditions may be employed that are efficacious to remove the materials to be removed from the PWB. After the PWBs have been exposed to the first composition, with or without ultrasonic irradiation, the electronic components are liberated, leaving the bare board with no traces of solder. The components either drop off or can be removed with minimal force.

Following the achievement of the desired removal, the first composition may be readily removed from the PWB to which it has previously been applied, as may be desired and efficacious in a given end use application of the compositions described herein. Preferably, the rinse solution includes deionized water. Thereafter, the PWB may be dried using nitrogen or a spin-dry cycle.

The solder removal process can be repeated with new batches of PWBs until the first composition is saturated with the ions of dissolved metals. It is desirable that the first composition is recycled and reused in new solder removal cycles. It is also desirable to eventually recover the dissolved metals from the first composition. There are a number of alternative technologies used for regeneration of tin and lead from solutions comprising same. One of them is diffusion dialysis, which takes place in a divided cell separated by an ion exchange membrane. The membrane allows the transport of acid and water molecules, but prevents the passing of metal ions. The acidic solution recovered in this manner can be immediately reused in the next solder removal cycle, and metals can be recovered by electrowinning from the concentrated metal solutions created. A solution comprising tin, lead or tin/lead alloy can also be regenerated and the metals can be recovered in a single step by subjecting the solution to electrolysis, whereby the metals deposit in metallic form on a cathode.

Advantageously, the method for the separation of electronic components from the surface of PWBs selectively removes the solder metals while the precious and base metals and the exposed epoxy of printed circuit laminate are unaffected. The method provides a fast and economically efficient process for recycling/reworking waste PWBs, including reclamation of electronic components and forming a stream of more easily recyclable bare boards containing only copper, fiberglass reinforced epoxy and gold/nickel/copper plating.

An Embodiment of a Composition to Selectively Remove Solder

In a second aspect, a first composition that selectively removes solder, (e.g., lead and/or tin-containing materials) relative to precious metals, tantalum-containing metals, and/or base metals is described. The first composition for solder removal has the following qualities:

1. It is selective as possible for the dissolution of only lead and tin. PWBs contain large amounts of different metals, including copper, zinc, aluminum, and iron. Non-desirable metals would saturate the first composition, making it less effective for the dissolution of target metals.
2. The first composition is effective in dissolving the solder so the mounted components could rapidly detach from the surface of PWBs.
3. The mounted components is recovered in saleable condition; that means they are preferably not be damaged or corroded by the first composition. For example, the tiny leads covered by solder that connect chips to the surface of PWBs are preferably not be affected.
4. The first composition removes gold plating during the process of the first aspect. PWBs contain metallic gold, which is present in the form of thin plating over nickel and copper, forming so-called "gold fingers." Accordingly, the ideal first composition leaves the gold plating unaffected.

In one embodiment, the first composition comprises, consists of, or consists essentially of at least one oxidizing agent. The first composition may further comprise at least one lead and/or tin complexing agent, at least one organic solvent, and/or at least one passivating agent for passivating the precious metals, tantalum-containing metals, and/or base metals. Accordingly, in one embodiment, the first composition comprises, consists of, or consists essentially of at least one lead and/or tin complexing agent in combination with at least one oxidizing agent. In another embodiment, the first composition comprises, consists of, or consists essentially of at least one lead and/or tin complexing agent, at least one oxidizing agent, and at least one passivating agent for passivating the precious metals, tantalum-containing metals, and/or base metal materials. In still another embodiment, the first composition comprises, consists of, or consists essentially of at least one lead and/or tin complexing agent, at least one oxidizing agent, and at least organic solvent. In yet another embodiment, the first composition comprises, consists of, or consists essentially of at least one lead and/or tin complexing agent, at least one oxidizing agent, at least one organic solvent, and at least one passivating agent for passivating the precious metals, tantalum-containing metals, and/or base metal materials. In another embodiment, the first composition comprises, consists of, or consists essentially of at least one oxidizing agent and at least one organic solvent, wherein the first composition is substantially devoid of nitric acid, sulfuric acid, or combinations thereof. In still another embodiment, the first composition comprises, consists of, or consists essentially of at least one oxidizing agent and at least one passivating agent for passivating the precious metals, tantalum-containing metals, and/or base metals, wherein the first composition is substantially devoid of nitric acid, sulfuric acid, or combinations thereof. In yet another embodiment, the first composition comprises, consists of, or consists essentially of at least one oxidizing agent, at least one organic solvent, and at least one passivating agent for passivating the precious metals and/or copper materials, wherein the first composition is substantially devoid of nitric acid, sulfuric acid, or combinations thereof. In still another embodiment, the first composition comprises, consists of, or consists essentially of at least one oxidizing agent, at least one organic solvent, and at least one passivating agent for passivating the precious metals, tantalum-containing metals, and/or base metal materials, wherein the first composition is substantially devoid of sulfuric acid. These compositions possess the selectivity of lead and/or tin-containing materials relative to precious metals, tantalum-containing metals, and/or base metals thereby increasing the loading of the bath for the solder and increasing the bath-life of the first composition. Ion-exchange resins selective to lead and/or tin can be used in combination with the first composition to further extend the life of the bath. It should be appreciated that the first composition is an aqueous composition.

It should be appreciated by the skilled artisan that the composition of the second aspect represents just one version of the first composition of the process of the first aspect. Other compositions are contemplated for use in the process of the first aspect, as readily determined by one skilled in the art.

Oxidizing agents are included in the composition to oxidize the metals to be removed into an ionic form and accumulate highly soluble salts of dissolved metals. Oxidizing agents contemplated herein include, but are not limited to, ozone, nitric acid ($HNO_3$), bubbled air, cyclohexylaminosulfonic acid, hydrogen peroxide ($H_2O_2$), oxone (potassium peroxymonosulfate, 2 $KHSO_5 \cdot KHSO_4 \cdot K_2SO_4$), ammonium polyatomic salts (e.g., ammonium peroxomonosulfate, ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), ammonium hypochlorite ($NH_4ClO$)), sodium polyatomic salts (e.g., sodium persulfate ($Na_2S_2O_8$), sodium hypochlorite ($NaClO$)), potassium polyatomic salts (e.g., potassium iodate ($KIO_3$), potassium permanganate ($KMnO_4$), potassium persulfate, potassium persulfate ($K_2S_2O_8$), potassium hypochlorite ($KClO$)), tetramethylammonium polyatomic salts (e.g., tetramethylammonium chlorite (($N(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($N(CH_3)_4)S_2O_8$)), tetrabutylammonium polyatomic salts (e.g., tetrabutylammonium peroxomonosulfate), peroxomonosulfuric acid, urea hydrogen peroxide (($CO(NH_2)_2)H_2O_2$), peracetic acid ($CH_3(CO)OOH$), sodium nitrate, potassium nitrate, ammonium nitrate, and combinations thereof. Although not oxidizing agents per se, for the sake of the present disclosure, oxidizing agents further include alkanesulfonic acids (e.g., methanesulfonic acid (MSA), ethanesulfonic acid, 2-hydroxyethanesulfonic acid, n-propanesulfonic acid, isopropanesulfonic acid, isobutenesulfonic acid, n-butanesulfonic acid, n-octanesulfonic acid), benzenesulfonic acid, benzenesulfonic acid derivatives (e.g., 4-methoxybenzenesulfonic acid, 4-hydroxybenzenesulfonic acid, 4-aminobenzenesulfonic acid, 4-nitrobenzenesulfonic acid, toluenesulfonic acid, hexylbenzenesulfonic acid, heptylbenzenesulfonic acid, octylbenzenesulfonic acid, nonylbenzenesulfonic acid, decylbenzenesulfonic acid, undecylbenzenesulfonic acid, dodecylbenzenesulfonic acid, tridecylbenzenesulfonic acid, tetradecylbenzene sulfonic acid, hexadecylbenzene sulfonic acid, 3-nitrobenzenesulfonic acid, 2-nitrobenzenesulfonic acid, 2-nitronaphthalenesulfonic acid, 3-nitronaphthalenesulfonic acid, 2,3-dinitrobenzenesulfonic acid, 2,4-dinitrobenzenesulfonic acid, 2,5-dinitrobenzenesulfonic acid, 2,6-dinitrobenzenesulfonic acid, 3,5-dinitrobenzenesulfonic acid, 2,4,6-trinitrobenzenesulfonic acid, 3-aminobenzenesulfonic acid, 2-aminobenzenesulfonic acid, 2-aminonaphthalenesulfonic acid, 3-aminonaphthalenesulfonic acid, 2,3-diaminobenzenesulfonic acid, 2,4-diaminobenzenesulfonic acid, 2,5-diaminobenzenesulfonic acid, 2,6-diaminobenzenesulfonic acid, 3,5-diaminobenzenesulfonic acid, 2,4,6-triaminobenzenesulfonic acid, 3-hydroxybenzenesulfonic acid, 2-hydroxybenzenesulfonic acid, 2-hydroxynaphthalenesulfonic acid, 3-hydroxynaphthalenesulfonic acid, 2,3-dihydroxybenzenesulfonic acid, 2,4-dihydroxybenzenesulfonic acid, 2,5-dihydroxybenzenesulfonic acid, 2,6-dihydroxybenzenesulfonic acid, 3,5-dihydroxybenzenesulfonic acid, 2,3,4-trihydroxybenzenesulfonic acid, 2,3,5-trihydroxybenzenesulfonic acid, 2,3,6-trihydroxybenzenesulfonic acid, 2,4,5-trihydroxybenzenesulfonic acid, 2,4,6-trihydroxybenzenesulfonic acid, 3,4,5-trihydroxybenzenesulfonic acid, 2,3,4,5-tetrahydroxybenzenesulfonic acid, 2,3,4,6-tetrahydroxybenzenesulfonic acid, 2,3,5,6-tetrahydroxybenzenesulfonic acid, 2,4,5,6-tetrahydroxybenzenesulfonic acid, 3-methoxybenzenesulfonic acid, 2-methoxybenzenesulfonic acid, 2,3-dimethoxybenzenesulfonic acid, 2,4-dimethoxybenzenesulfonic acid, 2,5-dimethoxybenzenesulfonic acid, 2,6-dimethoxybenzenesulfonic acid, 3,5-dimethoxybenzenesulfonic acid, 2,4,6-trimethoxybenzenesulfonic acid), and combinations thereof. The oxidizing agents can include a combination of the any of the species defined herein as oxidizing agent. The oxidizing agent may be introduced to the first composition at the manufacturer, prior to introduction of the first composition to the PWB, or alternatively at the PWB, i.e., in situ. Oxidizing agent is preferably present in the first composition an amount ranging from 0.1 to 90% by volume, more preferably from 10 to 60% by volume, and most preferably from 25 to 45% by volume. Preferably, the oxidizing agent comprises a peroxide compound, oxone, nitric acid and/or methanesulfonic acid. Most preferably, the oxidizing agent comprises methanesulfonic acid.

When present, it is thought that an effective amount of nitric acid serve as an accelerator of the solder removal process. Accordingly, in some embodiments, the oxidizing agent in the first composition preferably comprises an alkane sulfonic acid (e.g., MSA) and nitric acid, wherein the alkane sulfonic acid is present in an amount ranging from 0.1 to 90 vol %, more preferably from 10 to 60 vol %, and most preferably from 25 to 45 vol %, and the nitric acid is present in an amount of about 0.1 to 80 vol %, preferably from about 1 to 30 vol %, and most preferably from 5 to 15 vol %.

The complexing agents are included to complex the ions produced by the oxidizing agent. Complexing agents contemplated herein include, but are not limited to: β-diketonate compounds such as acetylacetonate, 1,1,1-trifluoro-2,4-pentanedione, and 1,1,1,5,5,5-hexafluoro-2,4-pentanedione; carboxylates such as formate and acetate and other long chain carboxylates; and amides (and amines), such as bis(trimethylsilylamide) tetramer. Additional chelating agents include amines and amino acids (i.e. glycine, serine, proline, leucine, alanine, asparagine, aspartic acid, glutamine, valine, and lysine), citric acid, acetic acid, maleic acid, oxalic acid, malonic acid, succinic acid, phosphonic acid, phosphonic acid derivatives such as hydroxyethylidene diphosphonic acid (HEDP), 1-hydroxyethane-1,1-diphosphonic acid, nitrilotris(methylenephosphonic acid), nitrilotriacetic acid, iminodiacetic acid, etidronic acid, ethylenediamine, ethylenediaminetetraacetic acid (EDTA), and (1,2-cyclohexylenedinitrilo)tetraacetic acid (CDTA), uric acid, tetraglyme, pentamethyldiethylenetriamine (PMDETA), 1,3,5-triazine-2,4,6-thithiol trisodium salt solution, 1,3,5-triazine-2,4,6-thithiol triammonium salt solution, sodium diethyldithiocarbamate, disubstituted dithiocarbamates ($R^1$($CH_2CH_2O)_2NR^2CS_2Na$) with one alkyl group ($R^2$=hexyl, octyl, decyl or dodecyl) and one oligoether ($R^1(CH_2CH_2O)_2$, where $R^1$=ethyl or butyl), ammonium sulfate, monoethanolamine (MEA), Dequest 2000, Dequest 2010, Dequest 2060s, diethylenetriamine pentaacetic acid, propylenediamine tetraacetic acid, 2-hydroxypyridine 1-oxide, ethylendiamine disuccinic acid (EDDS), N-(2-hydroxyethyl) iminodiacetic acid (HEIDA), sodium triphosphate penta basic, sodium and ammonium salts thereof, ammonium chloride, sodium chloride, lithium chloride, potassium chloride, ammonium sulfate, hydrochloric acid, sulfuric acid, and combinations thereof. Preferably, the complexing agent comprises HEDP, HEIDA, EDDS, sodium or ammonium salts thereof, sulfuric acid, or combinations thereof. The amount of oxidizing agent to complexing agent is in a volume percent ratio range from about 10:1 to about 1:10, preferably about 5:1 to about 1:5, and even more preferably about 2:1 to about 1:2, wherein the oxidizing agent constituent is dilute and present in a weight percent of about 1 wt % to about 50 wt %, e.g., a volume of 30 wt % hydrogen peroxide, and the complexing agent constituent is dilute and present in a weight percent of about 1 wt % to about 50 wt %, e.g., a volume of 1 wt % HEDP. For example, the first composition can comprise 1 part by volume of 30 wt % hydrogen peroxide plus 1 part by volume of a 1 wt % complexing agent.

Passivating agents for passivating the precious metals, tantalum-containing metals, and/or base metals include, but are not limited to, ascorbic acid, adenosine, L(+)-ascorbic acid, isoascorbic acid, ascorbic acid derivatives, citric acid, ethylenediamine, gallic acid, oxalic acid, tannic acid, ethylenediaminetetraacetic acid (EDTA), uric acid, 1,2,4-triazole (TAZ), triazole derivatives (e.g., benzotriazole (BTA), tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole), 2-mercaptobenzimidazole (MBI), 2-mercaptobenzothiazole, 4-methyl-2-phenylimidazole, 2-mercaptothiazoline, 5-aminotetrazole (ATA), 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, mercaptobenzimidazole, 4-methyl-4H-1,2,4-triazole-3-thiol, 5-amino-1,3,4-thiadiazole-2-thiol, benzothiazole, tritolyl phosphate, imidazole, indiazole, benzoic acid, boric acid, malonic acid, ammonium benzoate, catechol, pyrogallol, resorcinol, hydroquinone, cyanuric acid, barbituric acid and derivatives such as 1,2-dimethylbarbituric acid, alpha-keto acids such as pyruvic acid, adenine, purine, phosphonic acid and derivatives thereof, glycine/ascorbic acid, Dequest 2000, Dequest 7000, p-tolylthiourea, succinic acid, phosphonobutane tricarboxylic acid (PBTCA), sodium molybdate, ammonium molybdate, salts of chromate (e.g., sodium, potassium, calcium, barium), sodium tungstate, salts of dichromate (e.g., sodium, potassium, ammonium), suberic acid, azaleic acid, sebacic acid, adipic acid, octamethylene dicarboxylic acid, pimelic acid, dodecane dicarboxylic acid, dimethyl malonic acid, 3,3-diethyl succinic acid, 2,2-dimethyl glutaric acid, 2-methyl adipic acid, trimethyl adipic acid, 1,3-cyclopentane dicarboxylic acid, 1,4-cyclohexane dicarboxylic acid, terephthalic acid, isophthalic acid, 2,6-naphthalene dicarboxylic acid, 2,7-naphthalene dicaroxylic acid, 1,4-naphthalene dicarboxylic acid, 1,4-phenylenedioxy diacetic acid, 1,3-phenylenedioxy diacetic acid, diphenic acid, 4,4'-biphenyl dicarboxylic acid, 4,4'-oxydibenzoic acid, diphenylmethane-4,4'-dicarboxylic acid, diphenylsulfone-4,4'-dicarboxylic acid, decamethylene dicarboxylic acid, undecamethylene dicarboxylic acid, dodecamethylene dicarboxylic acid, orthophthalic acid, naphthalenedicarboxylic acid, paraphenylenedicarboxylic acid, trimellitic acid, pyromellitic acid, sodium phosphates (e.g., sodium hexametaphosphate), sodium silicates, and combinations thereof. Most preferably, the passivating agent comprises BTA, ATA, TAZ, triazole derivatives, ascorbic acid, sodium molybdate, or combinations thereof. In a particularly preferred embodiment, the passivating agent comprises sodium molybdate. More particularly, the role of the passivating agent is to reduce the composition's attack on copper. This prevents the thin gold plating on the copper from being undercut and lost as the copper dissolves, and it keeps such plating safe for a further gold extraction process. When present, the amount of passivating agent is in a range from about 0.01 to 5 wt %, preferably about 0.1 wt % to about 1 wt %, based on the total weight of the first composition.

Although not wishing to be bound by theory, it is thought that organic solvents enhance the metal etch rates by wetting the surface of the microelectronic device structure. Organic solvents contemplated herein include, but are not limited to, alcohols, ethers, pyrrolidinones, glycols, carboxylic acids, glycol ethers, amines, ketones, aldehydes, alkanes, alkenes, alkynes, and amides, more preferably alcohols, ethers, pyrrolidinones, glycols, carboxylic acids, and glycol ethers such as methanol, ethanol, isopropanol, butanol, and higher alcohols (including diols, triols, etc.), tetrahydrofuran (THF), N-methylpyrrolidinone (NMP), cyclohexylpyrrolidinone, N-octylpyrrolidinone, N-phenylpyrrolidinone, methyl formate, dimethyl formamide (DMF), dimethylsulfoxide (DMSO), tetramethylene sulfone (sulfolane), diethyl ether, phenoxy-2-propanol (PPh), propriopheneone, ethyl lactate, ethyl acetate, ethyl benzoate, acetonitrile, acetone, ethylene glycol, propylene glycol, dioxane, butyryl lactone, butylene carbonate, ethylene carbonate, propylene carbonate, dipropylene glycol, amphiphilic species (diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether, dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, and combinations thereof), branched non-fluorinated ether-linkage carboxylic acids $(CH_3CH_2)_nO(CH_2)_mCOOH$, where n=1 to 10 and m=1 to 10), unbranched non-fluorinated ether-linkage carboxylic acids $(CH_3CH_2)_nO(CH_2)_mCOOH$, where n=1 to 10 and m=1 to 10), branched non-fluorinated non-ether linkage carboxylic acids $(CH_3(CH_2)_nCOOH$, where n=1 to 10), unbranched non-fluorinated non-ether linkage carboxylic acids $(CH_3(CH_2)_nCOOH$, where n=1 to 10), dicarboxylic acids, tricarboxylic acids, and combinations thereof. Preferably, the organic solvent comprises diethylene glycol monobutyl ether, dipropylene glycol propyl ether, propylene glycol, or mixtures thereof. When present, the amount of organic solvent is in a range from about 0.01 wt % to about 25 wt %, preferably about 0.1 wt % to about 10 wt %, and most preferably about 0.1 wt % to about 5 wt %, based on the total weight of the first composition.

Typically hydrogen peroxide decomposes upon exposure to organics or metals, thus, compositions that contain hydrogen peroxide have a short shelf-life and thus must be mixed at the point of use. Due to the lack of infrastructure at some user sites, point of mix use is not an option because of a lack of proper plumbing and chemical delivery systems, which add cost to a manufacturing plant. Advantageously, when the first composition comprises the lead and/or tin complexing agent in combination with at least one oxidizing agent, the oxidizing agent is stabilized and thus can be pre-mixed, although it should be appreciated the said complexing agent and the at least one oxidizing agent may still be mixed at the point of use.

In another embodiment, the first composition comprises, consists of, or consists essentially of: at least one oxidizing agent; optionally at least one lead and/or tin complexing agent; optionally at least one organic solvent; optionally at least one passivating agent for passivating the precious metals, tantalum-containing metals, and/or base metals; and solder material. Preferably, the solder material comprises lead and/or tin-containing materials. The lead and/or tin-containing materials may be lead and/or tin ions dissolved and/or suspended in the composition described herein.

In still another embodiment, when the first composition includes nitric acid, the composition can further comprise ammonium sulfamate or sulfamic acid. The sulfamic ions are thought to stabilize the nitric acid and to suppress the evolution of toxic $NO_x$ fumes. When present, the amount of sulfamate ion is in a range from about 0.1 to 20 wt %, preferably of about 1 to 10 wt %, and most preferably of about 1 to 5 wt %, based on the total weight of the first composition.

In a particularly preferred embodiment, the first composition comprises, consists of, or consists essentially of MSA, at least one organic solvent, and at least one passivating agent, wherein the composition is substantially devoid of nitric acid, sulfuric acid, or combinations thereof. In another particularly preferred embodiment, the first composition comprises, consists of, or consists essentially of MSA, at least one glycol ether, and at least one passivating agent, wherein the composition is substantially devoid of nitric acid, sulfuric acid, or combinations thereof. In still another particularly preferred embodiment, the first composition comprises, consists of, or consists essentially of MSA, at least one glycol ether, and sodium molybdate, wherein the composition is substantially devoid of nitric acid, sulfuric acid, or combinations thereof. Even more preferably, the first composition comprises, consists of, or consists essentially of MSA, diethylene glycol monobutyl ether, sodium molybdate, and water, wherein the composition is substantially devoid of nitric acid, sulfuric acid, or combinations thereof. In still another embodiment, the first composition comprises, consists of, or consists essentially of MSA, at least one organic solvent, and at least one passivating agent, wherein the composition is substantially devoid of sulfuric acid. In yet another embodiment, the first composition comprises, consists of, or consists essentially of MSA, nitric acid, ammonium sulfamate, BTA, diethylene glycol monobutyl ether, and water, wherein the composition is substantially devoid of sulfuric acid. In another embodiment, the first composition comprises, consists of, or consists essentially of MSA, nitric acid, ammonium sulfamate, BTA and water, wherein the composition is substantially devoid of sulfuric acid. Additional embodiments of the first composition include (i) a first composition comprising, consisting of or consisting essentially of MSA, nitric acid, BTA and water; (ii) a first composition comprising, consisting of or consisting essentially of MSA, nitric acid, TAZ and water; (iii) a first composition comprising, consisting of or consisting essentially of MSA, nitric acid, 1-amino-1,2,4-triazole and water; (iv) a first composition comprising, consisting of or consisting essentially of MSA, nitric acid, 1-amino-1,2,3-triazole and water; (v) a first composition comprising, consisting of or consisting essentially of MSA, nitric acid, 1-amino-5-methyl-1,2,3-triazole and water; (vi) a first composition comprising, consisting of or consisting essentially of MSA, nitric acid, 3-amino-1,2,4-triazole and water; (vii) a first composition comprising, consisting of or consisting essentially of MSA, nitric acid, 3-mercapto-1,2,4-triazole and water; (viii) a first composition comprising, consisting of or consisting essentially of MSA, nitric acid, 3-isopropyl-1,2,4-triazole and water; (ix) a first composition comprising, consisting of or consisting essentially of MSA, nitric acid, MBI and water; (x) a first composition comprising, consisting of or consisting essentially of MSA, nitric acid, ATA and water; (xi) a first composition comprising, consisting of or consisting essentially of MSA, nitric acid, 2,4-diamino-6-methyl-1,3,5-triazine and water; (xii) a first composition comprising, consisting of or consisting essentially of MSA, nitric acid, ascorbic acid and water; (xiii) a first composition comprising, consisting of or consisting essentially of MSA, nitric acid, sodium molybdate and water; and (xiv) a first composition comprising, consisting of or consisting essentially of MSA, nitric acid, 3-amino-5-mercapto-1,2,4-triazole and water. Another first composition comprises, consists of, or consists essentially of sulfuric acid, oxone and propylene glycol.

It was found that the detachment and liberation of electronic components from the surface of PWBs can be achieved without addition of ferric nitrate if nitric acid is used in the first composition. In addition, the first composition can be substantially devoid of at least one of fluoride salts, other ferric salts, titanium (IV) salts, abrasive material, fluoroboric acid, and organic solvents including ethylene groups, e.g., ethylene, diethylene, triethylene, etc., and other HAP organic solvents. As used herein, "fluoride" species correspond to species including an ionic fluoride ($F^-$) or covalently bonded fluorine. It is to be appreciated that the fluoride species may be included as a fluoride species or generated in situ.

Advantageously, an easily recyclable chemical composition can be employed in a closed-loop process generating minimal waste. For example, when the first composition includes MSA, the MSA is easily recycled. For example, if the first composition includes MSA, a glycol ether and sodium molybdate, and said composition is contacted with Pb/Sn solder, the resulting composition including the Pb/Sn metals can be recycled by passing the composition through a carbon filter to remove the glycol ether and electrowinned to reclaim the Pb and Sn. The remaining solution including MSA can be reused. When no longer viable, the first composition can be rendered essentially non-toxic by electrowinning the Pb and Sn and neutralizing the excess acidity.

The first composition described can be used to selectively remove lead and/or tin-containing materials are compatible with the PWB components, for example, transistors, capacitors, heat sinks, IC's, resistors, integrated switches, processors, etc., as well as the precious metals, tantalum-containing metals, and/or base metals exposed on said PWB. Furthermore, the first compositions are water soluble, non-corrosive, non-flammable and of low toxicity.

It should be appreciated that the first composition can be used at the point of use as formulated or following dilution with water. Preferably, the diluent is deionized water and the extent of dilution is about 1:1 to about 10:1 (water to first composition concentrate).

The first composition described herein has pH in a range from about 1 to about 12 and can be adjusted depending on the complexing agent used (when present). For example, when the complexing agent comprises HEDP, HEIDA or, salts thereof, the pH of the composition will be highly acidic, e.g., in a range from about 1 to about 4. When the complexing agent comprises EDDS, the pH of the composition may be advantageously dialed in by using different sodium salts of EDDS. For example, compositions comprising EDDS having three sodium ions will have a pH in a range from about 4 to about 8, preferably about 5 to about 7. Compositions comprising EDDS having four sodium ions will have a pH in a range from about 8 to about 12, preferably about 9 to about 11.

Preferred embodiments of the first compositions described herein include compositions comprising, consisting or, or consisting essentially of (i) EDDS/$H_2O_2$, (ii) HEIDA/$H_2O_2$, and (iii) MSA, nitric acid, ammonium sulfamate, BTA, diethylene glycol monobutyl ether.

The first compositions described herein are easily formulated by simple addition of the respective ingredients and mixing to homogeneous condition. Furthermore, the first composition may be readily formulated as single-package formulations or multi-part formulations that are mixed at or before the point of use, e.g., the individual parts of the multipart formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Method of Removing Precious Metals by Undercutting Same

In a third aspect, a method of removing precious metals, e.g., gold, from a surface is described. It is well known in the art that PWB's include "gold fingers," which are readily exposed following the removal of solder and the components (e.g., transistors, capacitors, heat sinks, IC's, resistors, integrated switches, processors, etc.) from the PWB. The gold (as gold connectors or "gold fingers") overlies base metals such as copper and/or nickel-containing layers.

In one embodiment, a method of removing precious metals from the surface is described, wherein said precious metals are undercut from the surface. In another embodiment of the third aspect, the method comprises contacting said surface with a second composition, to selectively remove base metals relative to the precious metals present on said surface. The second composition etchingly removes the base metals (e.g., copper and/or nickel-containing layers) and undercuts the precious metals (e.g., gold), which delaminates from the surface and is readily collected (e.g., filtered) for further processing. Preferably, the surface includes a PWB. In another embodiment of the third aspect, the method comprises contacting said surface with a second composition in a vessel, and optionally producing ultrasonic cavitation or other agitation means in said vessel, as described hereinabove, to selectively remove base metals relative to the precious metals present on said surface. In yet another embodiment, a method of removing precious metals from a printed wire board is described, wherein said method comprises contacting said surface with a second composition in a vessel, and optionally producing ultrasonic cavitation or other agitation means in said vessel, to selectively remove base metals relative to the precious metals present on said surface. In another embodiment, a method of removing precious metals from a printed wire board is described, wherein said method comprises contacting said surface with a second composition in a closed vessel, and producing ultrasonic cavitation in said vessel, to selectively remove base metals relative to the precious metals present on said surface. In yet another embodiment, a method of removing precious metals from a printed wire board is described, wherein said method comprises contacting said surface with a second composition in a vessel to selectively remove base metals relative to the precious metals present on said surface, wherein no ultrasonics are used in the process of removing precious metals from the PWB.

Advantageously, new surfaces that have had the solder and components removed (e.g., according to the process of the first aspect or the equivalent thereof), that comprise base and precious metals, can be added to the second composition and the process of removing the base metals to capture the precious metals can be repeated until the second composition is saturated with the base metals. Following completion of the process of the third aspect, the second composition comprising the base metals can be processed to obtain useful forms of said base metals (e.g., electrochemically or by electrowinning). Further, the bare PWB board comprising fiberglass, copper and epoxy can be processed to liberate the copper sheets and fiberglass as disclosed herein.

In another embodiment of the third aspect, a method of removing precious metals from a printed wire board is described, wherein said method comprises contacting said surface with a second composition in a closed vessel, and producing ultrasonic cavitation in said vessel, to selectively remove base metals relative to the precious metals present on said surface. Although not wishing to be bound by theory, it is thought that the ultrasonics create intensive cavitation, leading to a dramatic increase in removal efficiency and the creation of special mechanical effects including, but not limited to, shear forces, high-speed jets and shock waves, which assist with the removal of the base metals relative to the precious metals. Although not wishing to be bound by theory, it is thought that the second composition creates a tunnelling effect under the precious metals when removing the base metals. This results in the desired undercutting and subsequent detachment of the precious metals as a collectable solid, which can be recovered from the second composition by filtration, centrifugation, froth flotation or any other appropriate solid-liquid separation method. The detached precious metals can be washed with water. Preferably, in this embodiment wherein ultrasonic cavitation is used, the second composition comprises an aqueous solution of persulfate salt, e.g., potassium persulfate, ammonium persulfate, tetramethylammonium persulfate or sodium persulfate, wherein the concentration of the persulfate salt in the second composition is in a range from about 0.01 wt % to about 10 wt %, preferably about 0.01 wt % to the limit of solubility. Low frequency ultrasound (20-40 kHz) is preferred, as the low frequency would result in the creation of fewer free radicals, which may contribute to the decomposition of persulfate solutions. It should be appreciated that known methods of stabilisation of persulfate solutions may be applied to prevent decomposition of the second composition, e.g., as disclosed in U.S. Pat. No. 3,644,150, which is hereby incorporated by reference herein in its entirety. U.S. Pat. No. 3,644,150 describes a method of stabilizing a leaching solution using a potassium salt of an organic sulfonic acid, although it should be appreciated that the utilization of the teachings of U.S. Pat. No. 3,644,150 are merely optional. The saturated second composition of this embodiment consists mainly of copper sulfate. To recover dissolved copper, the working second composition can be acidified and subjected to electrolysis, or cooled to precipitate and separate copper sulfate and ammonium sulfate as claimed in U.S. Pat. No. 3,399,090, which is hereby incorporated by reference herein in its entirety. U.S. Pat. No. 3,399,090 describes a method of separating a double salt of dissolved metal sulphate and ammonium sulphate from a solution comprising same by cooling the solution. It should be appreciated that the utilization of the teachings of U.S. Pat. No. 3,399,090 are merely optional.

In removal application when ultrasonic cavitation is not used, the second composition is contacted in any suitable manner to the PWB, e.g., by spraying the second composition on the PWB, by dipping (in a volume of the second composition) of the PWB, by contacting the PWB with another material, e.g., a pad, or fibrous sorbent applicator element, that has the second composition absorbed thereon, by contacting the PWB with a recirculating composition, or by any other suitable means, manner or technique, by which the second composition is brought into contact with the material(s) to be removed. To recover dissolved copper, the working second composition can be acidified and subjected to electrolysis, or cooled to precipitate and separate copper sulfate and ammonium sulphate as described herein.

In use of the compositions described herein for removing copper and/or nickel-containing materials from PWB's having same thereon, the second composition typically is contacted with the surface for a time of from about 5 sec to about 180 minutes, preferably about 1 min to 60 min, and most preferably about 5 minutes to about 45 minutes at temperature in a range of from about 20° C. to about 100° C., preferably in a range from about 20° C. to about 70° C. The temperature can be higher than 65° C. to prevent formation of solid complex precipitates when ammonium persulfate is used. Such contacting times and temperatures are illustrative, and any other suitable time and temperature conditions may be employed that are efficacious to remove the materials to be removed from the PWB.

After the PWBs have been exposed to the second composition, with or without ultrasonic irradiation, the precious metal has been liberated, leaving the bare board comprising fiberglass, copper sheet and epoxy. The precious metal is easily separated from the second composition comprising solubilized base metal and the precious metal can be rinsed with water and the rinse water can be than filtered to recover gold foils. The second composition can also be filtered to recuperate detached gold foils or a frothing agent can be added to the second composition and the detached foils can be skimmed from its surface. The second composition may be readily removed from the PWB to which it has previously been applied using a rinse solution. Preferably, the rinse solution includes deionized water. Thereafter, the PWB may be dried using nitrogen or a spin-thy cycle. New PWBs having gold thereon (e.g., PWBs that have had the components removed) can be added to the working second composition and the process can be repeated until the second composition is saturated with base metals. The spent second composition consists mainly of sulfate of the base metal(s). To recover dissolved metals, the solution can be acidified and subjected to electrolysis or electrowinning.

An Embodiment of a Composition for Undercutting Precious Metals

In a fourth aspect, the second composition that selectively removes base metals such as copper and/or nickel containing materials relative to precious metals (e.g., gold) is described, said composition comprising, consisting of, or consisting essentially at least one oxidizing agent. The second composition may further comprise at least one base metal complexing agent, at least one organic solvent and/or at least one passivating agent for passivating precious metals. Accordingly, in one embodiment, the second composition comprises, consists of, or consists essentially of at least one base metal complexing agent and at least one oxidizing agent. In another embodiment, the second composition comprises, consists of, or consists essentially of at least one oxidizing agent and at least one passivating agent for passivating precious metals. In yet another embodiment, the second composition comprises, consists of, or consists essentially of at least one oxidizing agent and at least one organic solvent. In still another embodiment, the second composition comprises, consists of, or consists essentially of at least one base metal complexing agent, at least one oxidizing agent, and at least one passivating agent for passivating precious metals. In another embodiment, the second composition comprises, consists of, or consists essentially of at least one base metal complexing agent, at least one oxidizing agent, and at least one organic solvent. Another embodiment of the second composition comprises, consists of, or consists essentially of at least one base metal complexing agent, at least one oxidizing agent, and at least one organic solvent, wherein the composition is substantially devoid of hydrogen peroxide. In still another embodiment, the second composition comprises, consists of, or consists essentially of at least one organic solvent, at least one oxidizing agent, and at least one passivating agent for passivating precious metals. In yet another embodiment, the second composition comprises, consists of, or consists essentially of at least one base metal complexing agent, at least one oxidizing agent, at least one organic solvent, and at least one passivating agent for passivating precious metals. Ion-exchange resins selective to the base metals can be used in combination with the second composition to extend the life of the bath. It should be appreciated that the second composition is an aqueous composition.

The base metal complexing agents can be selected from the list of complexing agents described herein, as readily determined by one skilled in the art. Preferably, the base metal complexing agents comprise sulfuric acid, chloride salts (e.g., $NH_4Cl$, $NaCl$, $KCl$, etc.), or combinations thereof. The oxidizing agents may be selected from the list of oxidizing agents described herein. Preferably, the oxidizing agent(s) of the second composition comprise oxone or a persulfate salt, e.g., potassium persulfate, ammonium persulfate, tetramethylammonium persulfate or sodium persulfate. The precious metal passivating agents can be selected from the list of passivating agents described herein, as readily determined by one skilled in the art. Preferably, the precious metal (e.g., gold) passivating agent(s) comprise sodium molybdate, sodium hexametaphosphate, suberic acid, or combinations thereof.

It should be appreciated by the skilled artisan that the composition of the fourth aspect represents just one version of the second composition of the process of the third aspect. Other compositions are contemplated for use in the process of the third aspect, as readily determined by one skilled in the art.

The amount of oxidizing agent to complexing agent is in a volume percent ratio range from about 10:1 to about 1:10, preferably about 5:1 to about 1:5, and even more preferably about 2:1 to about 1:2, wherein the oxidizing agent constituent is present in a weight percent of about 1 wt % to about 50 wt %, based on the total weight of the oxidizing agent constituent, and the complexing agent constituent is present in a weight percent of about 1 wt % to about 50 wt %, based on the total weight of the complexing agent constituent. For example, the second composition can comprise 1 part by volume of 30 wt % hydrogen peroxide plus 1 part by volume of a 1 wt % complexing agent. When present, the amount of passivating agent is in a range from about 0.01 wt % to about 5 wt %, preferably about 0.1 wt % to about 1 wt %, based on the total weight of the second composition. When present, the amount of organic solvent is in a range from about 0.01 wt % to about 25 wt %, preferably about 0.1 wt % to about 10 wt %, and most preferably about 0.1 wt % to about 5 wt %, based on the total weight of the second composition.

Advantageously, when the second composition comprises the at least one base metal complexing agent in combination with at least one oxidizing agent, the oxidizing agent is stabilized and thus can be pre-mixed, although it should be appreciated the complexing agent(s) and the oxidizing agent(s) may still be mixed at the point of use.

In another embodiment, the second composition comprises, consists of, or consists essentially of: at least one oxidizing agent; optionally at least one base metal complexing agent; optionally at least one organic solvent; optionally at least one passivating agent for passivating precious metals; and base metal materials. Preferably, the base metal materials comprise copper and/or nickel containing materials. The copper and/or nickel-containing materials may be copper and/or nickel metals or ions dissolved and/or suspended in the composition described herein.

Preferably, the second composition comprises, consists of, or consists essentially of oxone and at least one gold passivating agent. In a particularly preferred embodiment, the second composition comprises, consists of, or consists essentially of oxone and sodium molybdate. In another particularly preferred embodiment, the second composition comprises, consists of, or consists essentially of oxone and sodium hexametaphosphate. In still another embodiment, the second composition comprises, consists of, or consists essentially of oxone, at least one copper and/or nickel complexing agent, and at least one organic solvent. For example, the second composition can comprise, consist of, or consist essentially of oxone, sulfuric acid, and diethylene glycol monobutyl ether. Alternatively, the second composition can comprise, consist of, or consist essentially of oxone, sulfuric acid, and propylene glycol.

Advantageously, when the second composition includes oxone, the oxone is easily recycled. For example, if the second composition includes oxone and sodium molybdate, and said composition is contacted with Cu/Ni, the resulting composition including the Cu/Ni ions can be recycled by electrowinning to reclaim the Cu and Ni. The remaining solution including oxone can be reused.

Advantageously, when the second composition includes sulfuric acid, one of the products is copper sulfate, which can be reused as copper sulfate or alternatively, electrowon to reclaim copper metal.

It should be appreciated that the second composition can be used at the point of use as formulated or following dilution with water. Preferably, the diluent is deionized water and the extent of dilution is about 1:1 to about 10:1 (water to second composition concentrate).

The second composition described herein have pH in a range from about 1 to about 12 and can be adjusted depending on the complexing agent used (when present). For example, when the complexing agent comprises HEDP, HEIDA or, salts thereof, the pH of the composition will be highly acidic, e.g., in a range from about 1 to about 4. When the complexing agent comprises EDDS, the pH of the composition may be advantageously dialed in by using different sodium salts of EDDS. For example, compositions comprising EDDS having three sodium ions will have a pH in a range from about 4 to about 8, preferably about 5 to about 7. Compositions comprising EDDS having four sodium ions will have a pH in a range from about 8 to about 12, preferably about 9 to about 11.

In one embodiment the second compositions are substantially devoid of fluoride ions. In another embodiment, the second compositions are substantially devoid of abrasive material. Further, given the nature of the second compositions, they can be substantially devoid of organic solvents including ethylene groups, e.g., ethylene, diethylene, triethylene, etc., and other HAP organic solvents.

Preferred embodiments of the second composition described herein include compositions comprising, consisting or, or consisting essentially of (i) HEDP/$H_2O_2$, (ii) HEIDA/$H_2O_2$, (iii) sulfuric acid, oxone, diethylene glycol monobutyl ether, (iv) sulfuric acid, oxone, propylene glycol, (v) 15 wt % sulfuric acid, 12 wt % oxone, 0.8 wt % diethylene glycol monobutyl ether, (vi) 15 wt % sulfuric acid, 12 wt % oxone, 0.8 wt % propylene glycol, (vii) 10-20 wt % sulfuric acid, 7-17 wt % oxone, 0.1-2 wt % diethylene glycol monobutyl ether, and (viii) 10-20 wt % sulfuric acid, 7-17 wt % oxone, 0.1-2 wt % propylene glycol.

The second compositions described herein are easily formulated by simple addition of the respective ingredients and mixing to homogeneous condition. Furthermore, the second compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Method and Composition for Leaching Precious Metals from Solid

In a fifth aspect, a composition and a method of recovering precious metals, e.g., gold, from precious metal-containing materials is described, wherein said method comprises introducing the precious metal-containing materials to a leaching composition comprising triiodide. Said precious metal-containing materials include, but are not limited to, gold scrap, ores and other mining tailings and electronic waste (e-waste) such as PWBs and/or PWB components. In one embodiment, said method of the fifth aspect comprises introducing precious metal-containing materials to a leaching composition comprising triiodide in a vessel, and optionally producing ultrasonic cavitation in said vessel, wherein said leaching composition comprises triiodide, and wherein the precious metal is substantially removed from said precious metal-containing material. Preferably, the precious metal comprises gold. For example, following the removal of solder and the release of components from the surface of a PWB (e.g., according to the method of the first aspect or the equivalent thereof), the components may be separated into fractions using an optical system or some other means whereby the reusable components may be separated from precious metal-containing component fraction, the base metal-containing component fraction, and optionally the tantalum-containing component fraction. In one embodiment, the precious metal containing component fraction is further processed and the precious metal is leached from the PWB component fraction.

In another embodiment, the method of the fifth aspect corresponds to a method of recovering precious metals, e.g., gold, from PWB components, wherein said method comprises: introducing the PWB components to a leaching composition comprising triiodide, and optionally producing ultrasonic cavitation in said leaching composition, wherein the precious metals are substantially removed from said PWB components. The PWB components can be processed as is, or the PWB components may be crushed as defined herein.

In another embodiment, the method of the fifth aspect corresponds to a method of recovering precious metals, e.g., gold, from printed wire boards, wherein said method comprises: introducing the PWBs to a leaching composition comprising triiodide, and optionally producing ultrasonic cavitation in said leaching composition, wherein the precious metals are substantially removed from said PWBs. When recovering precious metals from the PWBs, the PWBs are preferably devoid of the PWB components (e.g., the components can be removed using the method of the first aspect described herein or any other method known in the art). The PWBs can be processed as is, or the PWBs may be crushed as defined herein.

It should be appreciated that the precious metal containing materials can be added to the leaching composition as is, pulverized into a powder, shredded into pieces, crushed such that the hard shell (e.g., plastic) is cracked and the metals contained therein exposed, or in any other form so long as the metals contained in the precious metal containing materials are readily exposed for removal from the materials. Preferably, the precious metal containing materials is crushed so that the reclamation yield is increased.

In use of the compositions described herein for leaching precious metals from precious metal containing materials, the composition of the fifth aspect typically is contacted with the precious metal containing materials for a time of from about 5 sec to about 180 minutes, preferably about 1 min to 60 min, and most preferably about 5 minutes to about 45 minutes at temperature in a range of from about 20° C. to about 60° C., preferably in a range from about 20° C. to about 40° C. Such contacting times and temperatures are illustrative, and any other suitable time and temperature conditions may be employed that are efficacious to remove precious metals from the precious metal containing materials. After the precious metal containing materials have been exposed to the leaching composition of the fifth aspect, with or without ultrasonic irradiation, the precious metal will be liberated.

In one embodiment, the precious metal removed from the precious metal containing materials is collected as solid metal without the necessity to use electrowinning or reducing agents according to the chemical reactions below which includes the ionization of gold by the tri-iodide solution to form stable complexes with gold according to:

$$2Au + I_3^- + I^- \rightarrow 2AuI_2^-$$

$$2Au + 3I_3^- \rightarrow 2AuI_4^- + I^-$$

wherein the trivalent gold complex is in equilibrium with the monovalent gold complex according to:

$$AuI_4^- + I^- \rightarrow AuI_2^- + I_3^-$$

The gold can be precipitated based on the disproportionation reaction, as readily understood by the skilled artisan:

$$3AuI_2^- \rightarrow 2Au^0 + AuI_4^- + 2I^-$$

Metallic gold can appear on the surface of the leaching composition in the form of tiny flakes. Addition of metallic gold foils (e.g., seeding) as well as cooling of the solution, although not obligatory, can increase the rate of gold removal. To facilitate gold removal, flocculating agent can be added to the composition (e.g., Magnaflok-351, Ciba Chemicals) and skimmed from the surface of the leaching composition together with gold particles. Advantageously, because reducing agents are not required to obtain the gold metal, new gold-containing material can be brought in contact with the tri-iodide leaching composition until the composition becomes saturated with leached metal again and new gold flakes appear on the surface for recovery, and so on. Advantageously, the disproportionation reaction is specific to gold over base metals and as such, no base metals will auto precipitate at the same time with gold. Accordingly, no additional measures for reducing the removal of base metals into the leaching composition are needed. Advantageously, the recovery of gold will not affect the leaching composition which can be reused infinitively for leaching of new precious metal containing material.

In another embodiment, a reducing agent is added to the leaching composition containing precious metals removed from the precious metal containing material to cause their precipitation. Depending on the precious metal content, various reducing agents can be applied to cause selective or non-selective precipitation of precious metals. Precipitation can be done in a manner to avoid the contamination of the leaching composition, so that the leaching composition can be regenerated and reused in the next leaching cycle after the precious metals have been removed. Preferably, the reducing agent is a so-called environmentally friendly chemical. Moreover, preferably the reduction occurs rapidly with minimal heating requirements. For example, precipitation with $SO_2$ is known to be selective for gold, non-contaminating to the leaching composition and inexpensive. Gold is precipitated as a fine powder that is separated from the leaching solution by filtration. To facilitate filtration, a flocculating agent can be added to the solution at the same time as the reducing agent, if the reducing agent is in liquid or gaseous form. If the reducing agent is in the form of powder, a flocculating agent can be added after complete dissolution of the reducing agent to prevent collection of particles of the reducing agent. For separation of gold powder, commercially available MAGNA-FLOK-351 (Ciba Specialty Chemicals) that is typically used for concentrating finely ground gold ores, can be used. The use of a non-ionic flocculating agent is preferred to avoid the possible undesirable recovery of iodine from the composition.

Alternatively, the reducing agents can include, but are not limited to, sodium borohydride, ascorbic acid, diethyl malonate, sodium metabisulfite, polyphenon 60 (P60, green tea extract), glucose, and sodium citrate. For example, as introduced in U.S. Provisional Patent Application No. 61/375,273 filed on Aug. 20, 2010 and entitled "Sustainable Process for Reclaiming Precious Metals and Base Metals from e-Waste," which is hereby incorporated by reference herein in its entirety, ascorbic acid introduced to a composition comprising $Au^{3+}$ ions at pH 1 produces highly pure gold metal. Sodium metabisulfite (SMB) can be added to a composition comprising $Au^{3+}$ ions at pH 1 or pH 7 and produce highly pure gold metal. Alternatively, the gold ions can be converted to gold metal via electrowinning or electrochemical techniques. Any suitable means can be used to remove the precipitated gold. Settling and decanting, filtering the solution through a filter press or centrifuging are convenient procedures for such removal.

After separation of the solid gold by filtering, centrifugation or any other appropriate method, the leaching composition may still include leached silver and palladium ions. A selective reducing agent may be added for precipitation of silver, such as hydroxylamine. The use of a flocculating agent is suggested to facilitate filtration. After separation of precipitated silver, only palladium will remain in the leaching solution and can be precipitated, for example, with the use of a stabilized alkali metal borohydride and a flocculating agent.

Although during the precious metal leaching process the dissolution of base metals is generally inhibited, some base metals can still accumulate in the composition after several repetitive leaching cycles. In order to remove these base metals, the leaching composition can be flowed through a packed column containing ion-exchange resins, where the dissolved base metals will be selectively captured, while the tri-iodide ions and the dissolved precious metals will pass through. The resins that can be used for this purpose are commercially available, strongly acidic cation exchangers (e.g., DOWEX ion exchange resins manufactured by The Dow Chemical Company). The purification of the leaching composition by base metal removal need not be a part of each leaching cycle, but can be repeated as often as the solution becomes polluted to the point that its effectiveness is negatively affected.

As soon as the leaching process is over and the loaded tri-iodide solution is separated from the leached material, the leached material can be rinsed (e.g., with water) to recover the leaching composition, which can contain very significant amounts of tri-iodide and dissolved gold.

Electrowinning is a common way of gold recovery from solutions, but if the rinse water comprising dissolved gold is recovered, conventional electrowinning becomes ineffective as gold is present in rinse water in small concentrations. The removal of gold from rinse water solutions can become effective if high surface area (HSA) electrodes are used for electrowinning HSA electrowinning may economically remove gold having a concentration greater than 10 ppm down to ppb level. Iodide can also be oxidized and recovered using the same process if an undivided electrowinning cell is used.

Alternatively, the gold-iodide complex from rinse water can be captured on ionic exchange resins, although gold and iodide will be absorbed on the resins together. To absorb the gold-iodide complex, strongly basic anion exchange resin (e.g., AMBERLITE IRA 410 from DOW) can be used. Gold cannot be easily eluted from these resins and, if used, in most cases the resins are burned off for gold recovery. The elution procedure may be facilitated as described in U.S. Pat. No. 5,051,128, which is mentioned here as a reference, wherein the gold-iodide complex can be easily eluted if strongly basic anion exchange resins are pre-treated with sulfuric acid and sodium nitrite. Elution itself takes place by reacting with sodium sulfite. This method offers the possibility to economically treat large amounts of diluted rinse water.

If for any reason the leaching composition must be discarded, all the dissolved iodide can be recovered in the form of iodine. The iodine can than be reused as make up additions to the newly prepared leaching solution. For iodine recovery, either oxidation of iodide to its solid state, or iodine recovery on the special resins can be used. For example, the reaction of hydrogen peroxide, ozone or sodium, potassium or ammonium persulfate with an aqueous solution of an iodide leads to the oxidation of iodide ions to iodine. For the recovery of iodine on resins, commercially available metal hydroxide loaded ion exchange resins such as DOWEX G-26 (H) (The Dow Chemical Company) can be used.

The tri-iodide ion can be introduced in the leaching composition of the fifth aspect by any known method including, but not limited to: dissolution of iodine in an aqueous solutions of iodides (e.g., KI, NaI, $NH_4I$) or hydroiodic acid; in situ generation of iodine which reacts with excess iodide to form triiodide; oxidation of aqueous solutions of iodides by nitric acid, ozone, hypochlorite and the like; irradiation of aqueous solutions of iodides by ultrasound; and reaction of an iodide with an iodate in acidic media. Several are described at length below.

(a) Generation of Triiodide Using Ultrasound

In yet another embodiment of the fifth aspect, a composition and a method of removing gold or other precious metals from e-waste is described, said method comprising contacting the e-waste with a leaching composition to leach gold or other precious metals from said e-waste, wherein ultrasonic irradiation of the leaching composition is applied. The desired effect can be achieved by: a) using a tri-iodide leaching composition that can serve as a selective leachant for precious metals, b) keeping the pH of the leaching composition only slightly acidic (preferably at least around pH=5, and more preferably close to acid-neutral) and the oxidation-reduction potential (ORP) between 100 and 900 mV to minimize the dissolution of base metals, c) adding special chemicals such as dibasic ammonium phosphate or dibasic potassium phosphate/phosphoric acid to prohibit the dissolution of base metals, and d) passing the composition through commercially available strong acid cation exchange resins, which will capture base metals but let tri-iodide and precious metals pass through.

The tri-iodide ions are formed directly upon the application of ultrasound in an aqueous composition containing only iodide, with no iodine initially present. Although not wishing to be bound by theory, it is thought that the irradiation of an aqueous solution of iodide ions with intense ultrasound results in the creation of hydroxyl radicals, which react with the iodide ions of the dissolved compound to liberate molecular iodine in situ. Molecular iodine then combines with the excess iodide present in the solution to form the brown coloured tri-iodide. For example, it is known that the release of iodide and the specific colour of the solution can serve as the indicators of cavitation created by ultrasonic irradiation. Using the in situ generated tri-iodide, gold is oxidized and forms the stable complexes $AuI_2^-$ and $AuI_4^-$ with iodine.

Advantageously, the application of ultrasound consists in providing a solution for precious metals leaching that does not require periodic re-oxidation to maintain the presence of the triiodide ions, as the triiodide is generated by oxidation of the iodide upon irradiation of ultrasound into the solution.

Besides chemical effects, consisting mainly of the formation of radicals in ultrasonically irradiated solutions, sonication also has mechanical effects on the chemical reaction, such as increasing the surface area between the reactants, accelerating dissolution and renewing the surface of a solid reactant. Cavitation, generated by ultrasound, has dramatic effects on the reactivities of solutions. Cavity collapse near an extended solid surface drives high-speed jets of liquid into the surface and creates shockwave damage. Shear forces, jets and shock waves result in rapid mass transfer, surface cleaning and metal activation. Micro jet impacts on the surfaces effectively remove any passivating coatings as surface oxides or contaminants, which dramatically increases reaction rates. Acoustic cavitation results in an enormous concentration of energy, i.e., very high local temperatures and pressures created under ultrasound irradiation. Cavitation collapse produces intense local heating (5000 K), high pressures (1000 atm), enormous heating and cooling rates (>109 K/sec) and liquid jet streams (~400 km/h).

Advantageously, the application of ultrasound results in the continuous generation of tri-iodide by oxidation of the iodide. Moreover, the following results can be achieved by creation of cavitation upon application of ultrasonic irradiation to the leaching composition for the recovery of precious metals from precious metal-containing e-waste: a) increase in reaction speed, b) increase in reaction output, c) ability to conduct the process at ambient temperatures and atmospheric pressure with short leaching times, d) utilization of only one chemical selected from the list including hydroiodic acid or any water-soluble iodide for the preparation of the leaching composition.

The leaching process may be organized for a batch process or a continuous process using an ultrasonic flow cell reactor. In the latter case, all input material pass through the reactor and are treated equally. When using a continuous flow process, a certain optimal combination of slurry flow rate, sonication amplitude and power can be found. Depending on the type of material and its precious metal content, different residence times in the ultrasound reactor may be required until the complete leaching of precious metals from the material is detected. The time of exposure of the material is determined by the material feed rate and the volume of the reactor. Several ultrasonic cell reactors may be used connected one after one to scale up the process efficiency.

After passing through the ultrasonic leaching reactor, a mixture of the treated material and the leaching solution can be forwarded to a vibrating screen for the separation of coarse particles. Fines are then separated from the leaching solution with the use of a pressure filter. Coarse and fine particles are subsequently rinsed with water to remove all the iodide residues. Wash water containing small amounts of triiodide is treated with ozone that oxidizes tri-odide to molecular iodine, which is collected in a gravity settler and is removed with the use of a polishing filter. Iodine recovered in this manner can be reused as a make up chemical in the next leaching cycle, as iodine dissolves in the aqueous solution of a soluble iodide or hydroiodic acid. Purified water may be used for the next rinse or for washing precious metals separated from the leaching solution before sending them to the oven. Clean coarse and fine particles, which do not contain any precious metals, can be sent to the next stage for recycling of base metals.

Depending on the precious metal content, various reducing agents can be applied to cause selective or non-selective precipitation of the precious metals from the leaching composition. Precipitation can be done in a manner to avoid the contamination of the leaching composition, so that the leaching composition can be regenerated and reused in the next leaching cycle after the precious metals have been removed. For example, precipitation with $SO_2$ is known to be selective for gold, non-contaminating to the leaching composition and inexpensive. Gold is precipitated as a fine powder that is separated from the leaching solution by filtration. To facilitate filtration, a flocculating agent can be added to the solution at the same time as the reducing agent, if the reducing agent is in liquid or gaseous form. If the reducing agent is in the form of powder, a flocculating agent can be added after complete dissolution of the reducing agent to prevent collection of particles of the reducing agent. For separation of gold powder, commercially available MAGNAFLOK-351 (Ciba Specialty Chemicals) that is typically used for concentrating finely ground gold ores, can be used. The use of a non-ionic flocculating agent is preferred to avoid the possible undesirable recovery of iodine from the composition.

(b) Generation of Iodine In Situ

In another embodiment, a method of removing gold or other precious metals from e-waste, e.g., PWBs and/or PWB components is described, said method comprising generating iodine ($I_2$) in situ to form a leaching composition comprising the in situ generated iodine, and contacting the PWBs and/or PWB components with the leaching composition to leach gold or other precious metals from the PWBs and/or PWB components. Preferably, the PWBs and/or PWB components are crushed prior to contact with the leaching composition. In a preferred embodiment, the method further comprises separating the leaching composition comprising the gold or other precious metals from the e-waste. Solid metal can be obtained by reducing the gold or other precious metals in the leaching composition (e.g., with a reducing agent suitable for such purpose). Advantageously, the method can be run at room temperature. Preferably gold is the precious metal separated from the e-waste.

In yet another embodiment, a method of removing gold or other precious metals from PWBs and/or PWB components is described, said method comprising generating iodine ($I_2$) in situ to form a leaching composition comprising the in situ generated iodine, contacting the PWBs and/or PWB components with the leaching composition to leach gold or other precious metals from the PWBs and/or PWB components, and separating the leaching composition comprising the gold or other precious metals from the PWBs and/or PWB components. Solid metal can be obtained by reducing the gold ions in the leaching composition (e.g., with a reducing agent suitable for such purpose). Preferably, the PWBs and/or PWB components are crushed prior to contact with the leaching composition.

In another embodiment, a method of removing gold or other precious metals from PWBs and/or PWB components is described, said method comprising generating iodine ($I_2$) in situ to form a leaching composition comprising the in situ generated iodine, contacting the PWBs and/or PWB components with the leaching composition to leach gold or other precious metals from the PWBs and/or PWB components, separating the leaching composition comprising the gold or other precious metals from the PWBs and/or PWB components, and reducing the gold ions in the leaching composition to form solid gold. Preferably, the PWBs and/or PWB components are crushed prior to contact with the leaching composition.

In yet another embodiment, a method of separating gold or other precious metals from a material comprising at least one base metal is described, said method comprising contacting a material comprising the gold or other precious metals and the at least one base metal with a composition under conditions to leach the gold or other precious metals from said material into a leaching composition, wherein said leaching composition comprises, consists of, or consists essentially of at least one oxidizing agent, at least one iodide salt or hydroiodic acid, water, optionally at least one organic solvent, optionally at least one surfactant, and optionally at least one passivating agent. In another aspect, the method further comprises separating the leaching composition comprising the gold or other precious metals from the material. Solid gold metal can be obtained by reducing the gold in the leaching composition (e.g., with a reducing agent suitable for such purpose).

Iodine ($I_2$) is very expensive and has low solubility in water but it can be generated in situ. Iodine in an aqueous solution of iodide is present as the triiodide ioin. The process utilizes iodine to oxidize the gold while iodide contributes to solubilizing the oxidized gold by formation of a gold iodide complex.

In one embodiment, the leaching composition comprises, consists of, or consists essentially of at least one oxidizing agent, at least one iodide salt or hydroiodic acid and water. In another embodiment, the leaching composition comprises, consists of, or consists essentially of at least one oxidizing agent, at least one iodide salt or hydroiodic acid, water, optionally at least one organic solvent, optionally at least one metal passivating agent, optionally at least one surfactant, optionally at least one buffering agent. In another embodiment, the leaching composition comprises, consists of, or consists essentially of at least one oxidizing agent, at least one iodide salt or hydroiodic acid, water, and at least one organic solvent. In still another embodiment, the leaching composition comprises, consists of, or consists essentially of at least one oxidizing agent, at least one iodide salt or hydroiodic acid, water, and at least one metal passivating agent. In still another embodiment, the leaching composition comprises, consists of, or consists essentially of at least one oxidizing agent, at least one iodide salt or hydroiodic acid, water, at least one metal passivating agent, and at least one buffering agent. In still another embodiment, the leaching composition comprises, consists of, or consists essentially of at least one oxidizing agent, at least one iodide salt or hydroiodic acid, water, and at least one surfactant. In yet another embodiment, the leaching composition comprises, consists of, or consists essentially of at least one oxidizing agent, at least one iodide salt or hydroiodic acid, water, at least one organic solvent, and at least one metal passivating agent. In yet another embodiment, the leaching composition comprises, consists of, or consists essentially of at least one oxidizing agent, at least one iodide salt or hydroiodic acid, water, at least one organic solvent, and at least one surfactant. In yet another embodiment, the leaching composition comprises, consists of, or consists essentially of at least one oxidizing agent, at least one iodide salt or hydroiodic acid, water, at least one surfactant, and at least one metal passivating agent. In yet another embodiment, the leaching composition comprises, consists of, or consists essentially of at least one oxidizing agent, at least one iodide salt or hydroiodic acid, water, at least one organic solvent, at least one surfactant, and at least one metal passivating agent. It is understood that the iodide salt or hydroiodic acid and the oxidizing agent present in the leaching composition will react to form iodine in situ and iodide ion will be in excess, resulting in the formation of triiodide. Accordingly, the leaching composition subsequent to the in situ reaction will comprise, consist of, or consist essentially of triiodide and water. In another embodiment, the leaching composition subsequent to the in situ reaction will comprise, consist of, or consist essentially of triiodide, water, and at least one organic solvent. In still another embodiment, the leaching composition subsequent to the in situ reaction will comprise, consist of, or consist essentially of triiodide, water, and at least one passivating agent. In still another embodiment, the leaching composition subsequent to the in situ reaction will comprise, consist of, or consist essentially of triiodide, water, and at least one surfactant. In yet another embodiment, the leaching composition subsequent to the in situ reaction will comprise, consist of, or consist essentially of triiodide, water, at least one organic solvent, and at least one passivating agent. In yet another embodiment, the leaching composition subsequent to the in situ reaction will comprise, consist of, or consist essentially of triiodide, water, at least one organic solvent, and at least one surfactant. In yet another embodiment, the leaching composition subsequent to the in situ reaction will comprise, consist of, or consist essentially of triiodide, water, at least one surfactant, and at least one passivating agent. In yet another embodiment, the leaching composition subsequent to the in situ reaction will comprise, consist of, or consist essentially of triiodide, water, at least one organic solvent, at least one surfactant, and at least one passivating agent. The leaching composition is formulated to substantially leach gold from the e-waste into a fraction that can be further processed to reclaim said gold. For example, in one embodiment, the leaching composition can be used to separate gold or other precious from base metals, wherein the base metals remain as a solid.

In application, the leaching composition is contacted in any suitable manner to the e-waste, e.g., by spraying the composition on the e-waste, by dipping (in a volume of the composition) of the e-waste, by contacting the e-waste with another material, e.g., a pad, or fibrous sorbent applicator element, that has the composition absorbed thereon, or by any other suitable means, manner or technique, by which a composition is brought into contact with the e-waste.

Following the process of contacting the PWBs and/or PWB components with the leaching composition to leach gold or other precious metals from the PWBs and/or PWB components, the leaching composition comprising the gold or other precious metals can be separated from the PWBs and/or PWB components and precipitates that may be present. Separation techniques include filtration, centrifugation, decanting, or a combination of any of these.

It is to be appreciated by the skilled artisan that contacting the PWBs and/or PWB components with the leaching composition to leach gold or other precious metals from the PWBs and/or PWB components can be done (i) with working leaching composition until the leaching composition approaches maximum loading or alternatively, (ii) a "feed and bleed" process may be used wherein clean leaching composition is periodically introduced to the working leaching composition with simultaneous withdrawal of some of the working leaching composition.

In use of the leaching composition, the composition typically is contacted with the e-waste for a time of from about 1 minute to about 200 minutes, preferably about 1 min to about 60 min, more preferably about 5 min to about 45 min, at temperature in a range of from about 20° C. to about 70° C., preferably in a range from about 20° C. to about 30° C. Such contacting times and temperatures are illustrative, and any other suitable time and temperature conditions may be employed that are efficacious to separate gold or other precious metals from the e-waste into a fraction that can be further processed to reclaim said metal.

Potential oxidizing agents are defined herein in the second aspect. Preferably, the oxidizing agent comprises oxone, sodium persulfate, ammonium persulfate, potassium persulfate, nitric acid, hydrogen peroxide, ferric chloride, ferric nitrate, or combinations thereof. Even more preferably, the oxidizing agent comprises ammonium persulfate, sodium persulfate, nitric acid, periodic acid, oxone, sodium hypochlorite, or combinations thereof. The amount of oxidizing agent is in a range from about 0.01 wt % to about 25 wt %, preferably about 1 wt % to about 20 wt %, and most preferably about 1 wt % to about 10 wt %.

Iodide salts include, but are not limited to, lithium iodide, sodium iodide, potassium iodide, ammonium iodide, calcium iodide, magnesium iodide, and tetraalkylammonium iodides, wherein the alkyl groups may be the same as or different from one another and are selected from the group consisting of straight-chained $C_1$-$C_6$ alkyls (e.g., methyl, ethyl, propyl, butyl, pentyl, hexyl) and branched $C_1$-$C_6$ alkyls. Preferably, the iodide salt comprises potassium iodide. Hydroiodic acid can be used instead of an iodide salt. The amount of iodide salt is in a range from about 0.1 wt % to about 50 wt %, preferably about 1 wt % to about 40 wt %, and most preferably about 10 wt % to about 35 wt %.

Potential organic solvents are defined herein in the second aspect. Most preferably, the organic solvent comprises an alcohol, diethylene glycol monobutyl ether, propylene glycol, dipropylene glycol n-butyl ether, and combinations thereof. When included, the amount of organic solvent is in a range from about 0.01 wt % to about 20 wt %, preferably about 1 wt % to about 10 wt %, and most preferably about 1 wt % to about 5 wt %.

Potential passivating agents are defined herein in the second aspect. When included, the amount of passivating agent is in a range from about 0.01 wt % to about 10 wt %, preferably about 0.05 wt % to about 5 wt %, and most preferably about 0.05 wt % to about 2 wt %.

Surfactants contemplated include, but are not limited to, acids and bases, non-ionic surfactants, anionic surfactants, cationic surfactants, zwitterionic surfactants, and combinations thereof. Preferred acidic or basic surfactants include, but are not limited to, surfactants having an acid or base functionality ("head") and a straight-chained or branched hydrocarbon group ("tail") and/or surfactants having an acid functionality ("head") and a perfluorinated hydrocarbon group ("tail"). Preferred acid or base functionalities include phosphoric, phosphonic, phosphonic monoesters, phosphate monoesters and diesters, carboxylic acids, dicarboxylic acid monoesters, tricarboxylic acid mono- and diesters, sulfate monoesters, sulfonic acids, amines, and salts thereof. The hydrocarbon groups preferably have at least 10, e.g., 10-20, carbon atoms (e.g., decyl, undecyl, dodecyl, tridecyl, tetradecyl, pentadecyl, hexadecyl, heptadecyl, octadecyl, nonadecyl, eicosyl), except that somewhat shorter hydrocarbon groups of 6-16 carbons (e.g. hexyl, 2-ethylhexyl, dodecyl) are preferred where the molecule contains two alkyl chains such as in phosphate diesters and phosphonate monoesters. The perfluorinated hydrocarbon groups preferably have 7-14 carbon atoms (e.g., heptyl, octyl, nonyl, decyl, undecyl, dodecyl, tridecyl, tetradecyl). Preferred surfactants include decylphosphonic acid, dodecylphosphonic acid, tetradecylphosphonic acid, hexadecylphosphonic acid, bis(2-ethylhexyl)phosphate, octadecylphosphonic acid, perfluoroheptanoic acid, prefluorodecanoic acid, trifluoromethanesulfonic acid, phosphonoacetic acid, dodecylbenzenesulfonic acid, and dodecylamine.

Non-ionic surfactants contemplated include, but are not limited to, polyoxyethylene lauryl ether (Emalmin NL-100 (Sanyo), Brij 30, Brij 98), dodecenylsuccinic acid monodiethanol amide (DSDA, Sanyo), ethylenediamine tetrakis (ethoxylate-block-propoxylate) tetrol (Tetronic 90R4), polyoxyethylene polyoxypropylene glycol (Newpole PE-68 (Sanyo), Pluronic L31, Pluronic 31R1), polyoxypropylene sucrose ether (SN008S, Sanyo), t-octylphenoxypolyethoxyethanol (Triton X100), Polyoxyethylene (9) nonylphenylether, branched (IGEPAL CO-250), polyoxyethylene sorbitol hexaoleate, polyoxyethylene sorbitol tetraoleate, polyethylene glycol sorbitan monooleate (Tween 80), sorbitan monooleate (Span 80), alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives such as SIS6952.0 (Siliclad, Gelest), siloxane modified polysilazane such as PP1-SG10 Siliclad Glide 10 (Gelest), silicone-polyether copolymers such as Silwet L-77 (Setre Chemical Company), Silwet ECO Spreader (Momentive), and alcohol ethoxylates (Natsurf™ 265, Croda).

Cationic surfactants contemplated include, but are not limited to, heptadecanefluorooctane sulfonic acid tetraethylammonium, stearyl trimethylammonium chloride (Econol TMS-28, Sanyo), 4-(4-diethylaminophenylazo)-1-(4-nitrobenzyl)pyridium bromide, cetylpyridinium chloride monohydrate, benzalkonium chloride, benzethonium chloride benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis (decyl)ammonium bromide, Aliquat® 336 and oxyphenonium bromide. The hydrocarbon groups preferably have at least 10, e.g., 10-20, carbon atoms (e.g., decyl, undecyl, dodecyl, tridecyl, tetradecyl, pentadecyl, hexadecyl, heptadecyl, octadecyl, nonadecyl, eicosyl), except that somewhat shorter hydrocarbon groups of 6-20 carbons (e.g. hexyl, 2-ethylhexyl, dodecyl) are preferred where the molecule contains two functionized alkyl chains such as in dimethyldioctadecylammonium chloride, dimethyldihexadecylammonium bromide and di(hydrogenated tallow) dimethylammonium chloride.

Anionic surfactants contemplated include, but are not limited to, sodium polyoxyethylene lauryl ether, sodium dihexylsulfosuccinate, dicyclohexyl sulfosuccinate sodium salt, sodium 7-ethyl-2-methyl-4-undecyl sulfate (Tergitol 4), SODOSIL RM02, and phosphate fluorosurfactants such as Zonyl FSJ.

Zwitterionic surfactants include, but are not limited to, ethylene oxide alkylamines (AOA-8, Sanyo), N,N-dimethyldodecylamine N-oxie, sodium cocaminpropinate (LebonApl-D, Sanyo), 3-(N,N-dimethylmyristylammonio)propanesulfonate, and (3-(4-heptyl)phenyl-3-hydroxypropyl) dimethylammoniopropanesulfonate.

Inorganic acids may be optionally added to any of the leaching compositions. For example, the leaching composition may further include sulfuric, hydrochloric, hydrobromic, or hydroiodic acid.

The pH of the leaching composition is preferably about 3 to about 10, more preferably about 4 to about 8 and most preferably about 6 to about 8. In a preferred embodiment, a buffering agent is added to maintain the pH of the leaching composition in the range from about 5 to about 8. Buffering agents are well known in the art and can include, for example, phosphate buffer such as monosodium phosphate/disodium phosphate or monopotassium phosphate/dipotassium phosphate.

In one embodiment, the leaching composition comprises, consists of, or consists essentially of at least one oxidizing agent, at least one iodide ion, water, optionally at least one organic solvent, optionally at least one passivating agent, optionally at least one surfactant, optionally buffering agent, and gold or other precious metal ions. Considered after the in situ reaction, the leaching composition comprises, consists of, or consists essentially of triiodide, water, optionally at least one organic solvent, optionally at least one passivating agent, optionally at least one surfactant, optionally buffering agent, and gold or other precious metal ions.

The leaching compositions are easily formulated by simple addition of the respective ingredients and mixing to homogeneous condition. Furthermore, the compositions may be readily formulated as multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions can variously and alternatively comprise, consist or consist essentially of any combination of ingredients consistent with the disclosure herein.

Preferably, in one embodiment, the leaching composition comprises, consists of, or consists essentially of potassium iodide, sodium persulfate and water, more preferably about 20 wt % to about 30 wt % potassium iodide, about 4 wt % to about 10 wt % sodium persulfate and water. In another embodiment, the leaching composition comprises, consists of, or consists essentially of potassium iodide, ammonium persulfate and water, more preferably about 20 wt % to about 30 wt % potassium iodide, about 4 wt % to about 10 wt % ammonium persulfate and water. In yet another embodiment, the leaching composition comprises, consists of, or consists essentially of potassium iodide, sodium persulfate, BTA, and water. In yet another embodiment, the leaching composition comprises, consists of, or consists essentially of potassium iodide, sodium persulfate, BTA, phosphate buffer, and water. In still another embodiment, the leaching composition comprises, consists of, or consists essentially of potassium iodide, nitric acid and water. In another embodiment, the leaching composition comprises, consists of, or consists essentially of potassium iodide, periodic acid, hydrochloric acid and water. The leaching composition in another embodiment comprises, consists of, or consists essentially of potassium iodide, oxone and water. In still another embodiment, the leaching composition comprises, consists of, or consists essentially of potassium iodide, sodium hypochlorite, hydrochloric acid and water. In yet another embodiment, the leaching composition comprises, consists of, or consists essentially of potassium iodide, in situ generated iodine and water. The leaching compositions are substantially devoid of aqua regia and cyanide-containing components. Preferably, the leaching compositions are water soluble, non-corrosive, non-flammable and of low toxicity.

It should be appreciated by the skilled artisan that once the gold or other precious metals are leached from the PWBs and/or PWB components, the remaining material(s) may be disposed of, recycled or undergo further reclamation. Following the extraction/leaching of the gold or other precious metals into the leaching composition, the gold or other precious metals can be obtained by reducing the metal ions, as will be discussed at length hereinbelow.

Reduction of the metal ions to solid, high purity metals is well known to the skilled artisan. Preferably, the reducing agent is a so-called environmentally friendly chemical. Moreover, preferably the reduction occurs rapidly with minimal heating requirements. For example, preferred reducing agents include, but are not limited to, ascorbic acid, diethyl malonate, sodium metabisulfite, polyphenon 60 (P60, green tea extract), glucose, and sodium citrate. For example, as introduced in U.S. Provisional Patent Application No. 61/375,273 filed on Aug. 20, 2010 and entitled "Sustainable Process for Reclaiming Precious Metals and Base Metals from e-Waste," which is hereby incorporated by reference herein in its entirety, ascorbic acid introduced to a composition comprising $Au^{3+}$ ions at pH 1 produces highly pure gold metal. Sodium metabisulfite (SMB) can be added to a composition comprising $Au^{3+}$ ions at pH 1 or pH 7 and produce highly pure gold metal. Alternatively, the gold ions can be converted to gold metal via electrowinning or electrochemical techniques. Any suitable means can be used to remove the precipitated gold. Settling and decanting, filtering the solution through a filter press or centrifuging are convenient procedures for such removal.

In another embodiment, iodide-iodine solution regeneration is accomplished by (a) decreasing the pH of the solution to below 7 after precipitation of the gold or other precious metals and (b) adding an oxidizing agent to the solution. After repeated regenerations if any interfering salt buildup decreases the effectiveness of the solution all iodine can be recovered as elemental iodine by precipitation from solution by acidifying and adding an oxidizing agent. The resulting elemental iodine crystals can be removed and used to form a new leaching composition.

Method of Processing Bare Boards

Following the removal of PWB components (e.g., as described in the method of the first aspect) and precious metals (e.g., as described in the method of the third or fifth aspect), the original PWB has typically been stripped to a "bare board" comprising a fiberglass layer and a copper sheet that are held together by an adhesive such as epoxy. The bare board can be further processed to liberate the fiberglass-epoxy layer from the copper.

In one embodiment of the sixth aspect, the bare board can be processed by degrading the epoxy, which liberates the copper sheet from the fiberglass. The epoxy can be degraded using a composition that chemically degrades the epoxy, as readily determined by one skilled in the art. Ultrasonics or other agitation means can be used in the liberation of the copper sheet from the fiberglass.

In another embodiment of the sixth aspect, the bare board can be processed by a process of wet grinding the bare board in a copper etchant. The solution produced will comprise a solid powder in a copper-containing solution, which can be physically separated from one another using methods known in the art (e.g., centrifugation, decanting, filtering, etc.). The copper etchant can be the composition of the fourth aspect described herein or alternatively, sulfuric acid aerated with oxygen or ozone or $H_2O_2$ or any other solution capable of dissolving metallic copper without affecting fiberglass and epoxy. The solid powder, which comprises the fiberglass and epoxy can be further processed to degrade the epoxy to liberate the fiberglass powder for reuse. The copper-containing solution, e.g., copper sulfate, can be sold as is or further processed to liberate copper metal therefrom (e.g., electrowinning, etc.).

Methods of Recycling Printed Wire Boards

One embodiment of seventh aspect corresponds to a process of removing at least one component from a surface, e.g., a PWB, as generalized in FIG. 1, said method comprising:
(a) the method of the first aspect; and
(b) the method of the third aspect,
or
(a) removing solder from the surface, wherein the removal of solder releases at least one component from the surface; and
(b) removing base metals from the surface, thereby undercutting the precious metals from the surface, or
(a) removing solder from the surface, wherein the removal of solder releases at least one component from the surface; and
(b) contacting said surface with a second composition in a vessel, and optionally producing ultrasonic cavitation or other agitation means in said vessel, to selectively remove base metals relative to the precious metals present on said surface thereby undercutting the precious metals from the surface,
or
(a) contacting solder with a first composition in a vessel, and optionally producing ultrasonic cavitation or other agitation means in said vessel, to selectively remove the solder relative to precious metals, tantalum-containing metals, and/or base metals that are simultaneously present on said surface, wherein the removal of solder releases at least one component from the surface; and
(b) removing base metals from the surface, thereby undercutting the precious metals from the surface, or
(a) contacting solder with a first composition in a vessel, and optionally producing ultrasonic cavitation or other agitation means in said vessel, to selectively remove the solder relative to precious metals, tantalum-containing metals, and/or base metals that are simultaneously present on said surface, wherein the removal of solder releases at least one component from the surface; and
(b) contacting said surface with a second composition in a vessel, and optionally producing ultrasonic cavitation or other agitation means in said vessel, to selectively remove base metals relative to the precious metals present on said surface thereby undercutting the precious metals from the surface.

Figure 2:
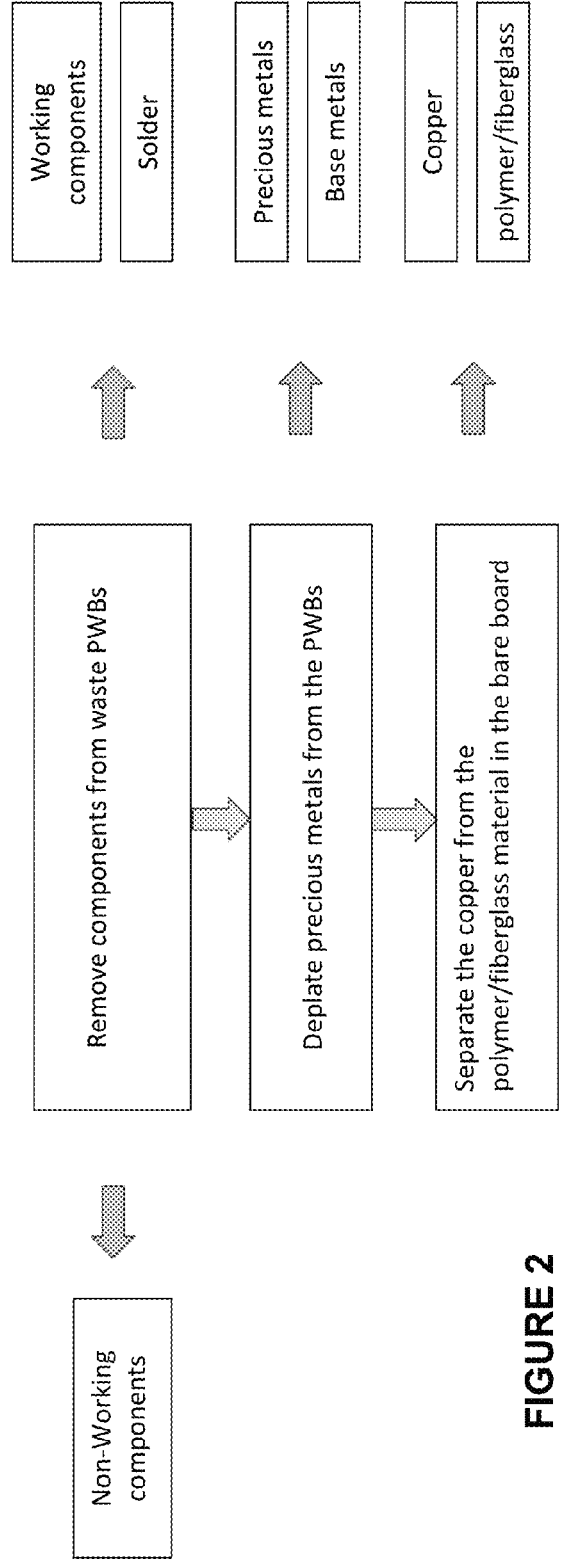
FIG. 2 illustrates a second embodiment of the method of recycling printed wire boards.

A second embodiment of seventh aspect corresponds to a process of removing at least one component from a surface e.g., a PWB, as generalized in FIG. 2, said method comprising:
(a) the method of the first aspect;
(b) the method of the third aspect; and
(c) the method of the sixth aspect,
or
(a) removing solder from the surface, wherein the removal of solder releases at least one component from the surface;
(b) removing base metals from the surface, thereby undercutting the precious metals from the surface to yield a bare board comprising fiberglass and copper; and
(c) separating the fiberglass and copper of the bare board,
or
(a) removing solder from the surface, wherein the removal of solder releases at least one component from the surface;
(b) contacting said surface with a second composition in a vessel, and optionally producing ultrasonic cavitation or other agitation means in said vessel, to selectively remove base metals relative to the precious metals present on said surface thereby undercutting the precious metals from the surface, to yield a bare board comprising fiberglass and copper; and
(c) separating the fiberglass and copper of the bare board,
or
(a) contacting solder with a first composition in a vessel, and optionally producing ultrasonic cavitation or other agitation means in said vessel, to selectively remove the solder relative to precious metals, tantalum-containing metals, and/or base metals that are simultaneously present on said surface, wherein at least one component is released from the surface when the solder is removed, wherein the removal of solder releases at least one component from the surface;
(b) removing base metals from the surface, thereby undercutting the precious metals from the surface, to yield a bare board comprising fiberglass layer and copper; and
(c) separating the fiberglass layer and copper of the bare board,
or
(a) contacting solder with a first composition in a vessel, and optionally producing ultrasonic cavitation or other agitation means in said vessel, to selectively remove the solder relative to precious metals, tantalum-containing metals, and/or base metals that are simultaneously present on said surface, wherein at least one component is released from the surface when the solder is removed, wherein the removal of solder releases at least one component from the surface;
(b) contacting said surface with a second composition in a vessel, and optionally producing ultrasonic cavitation or other agitation means in said vessel, to selectively remove base metals relative to the precious metals present on said surface thereby undercutting the precious metals from the surface, to yield a bare board comprising fiberglass layer and copper; and
(c) separating the fiberglass layer and copper of the bare board.

Figure 3:
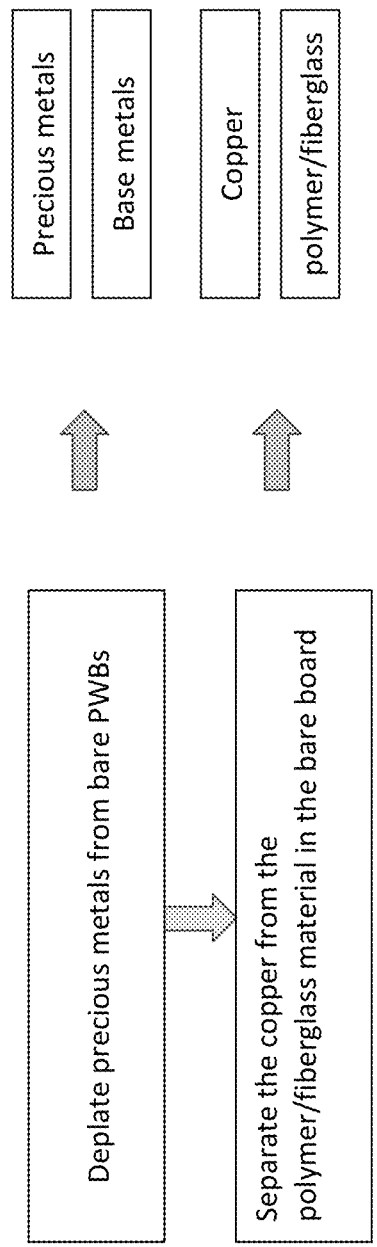
FIG. 3 illustrates a third embodiment of the method of recycling printed wire boards.

A third embodiment of seventh aspect corresponds to a process of removing at least one component from a surface e.g., a PWB, as generalized in FIG. 3, said method comprising:
(a) the method of the third aspect; and
(b) the method of the sixth aspect,
or
(a) removing base metals from the surface, thereby undercutting the precious metals from the surface, to yield a bare board comprising fiberglass layer and copper;
(b) separating the fiberglass material and copper of the bare board,
or
(a) contacting said surface with a second composition in a vessel, and optionally producing ultrasonic cavitation or other agitation means in said vessel, to selectively remove base metals relative to the precious metals present on said surface thereby undercutting the precious metals from the surface, to yield a bare board comprising fiberglass and copper;
(b) separating the fiberglass material and copper of the bare board.

Figures 4, 5:
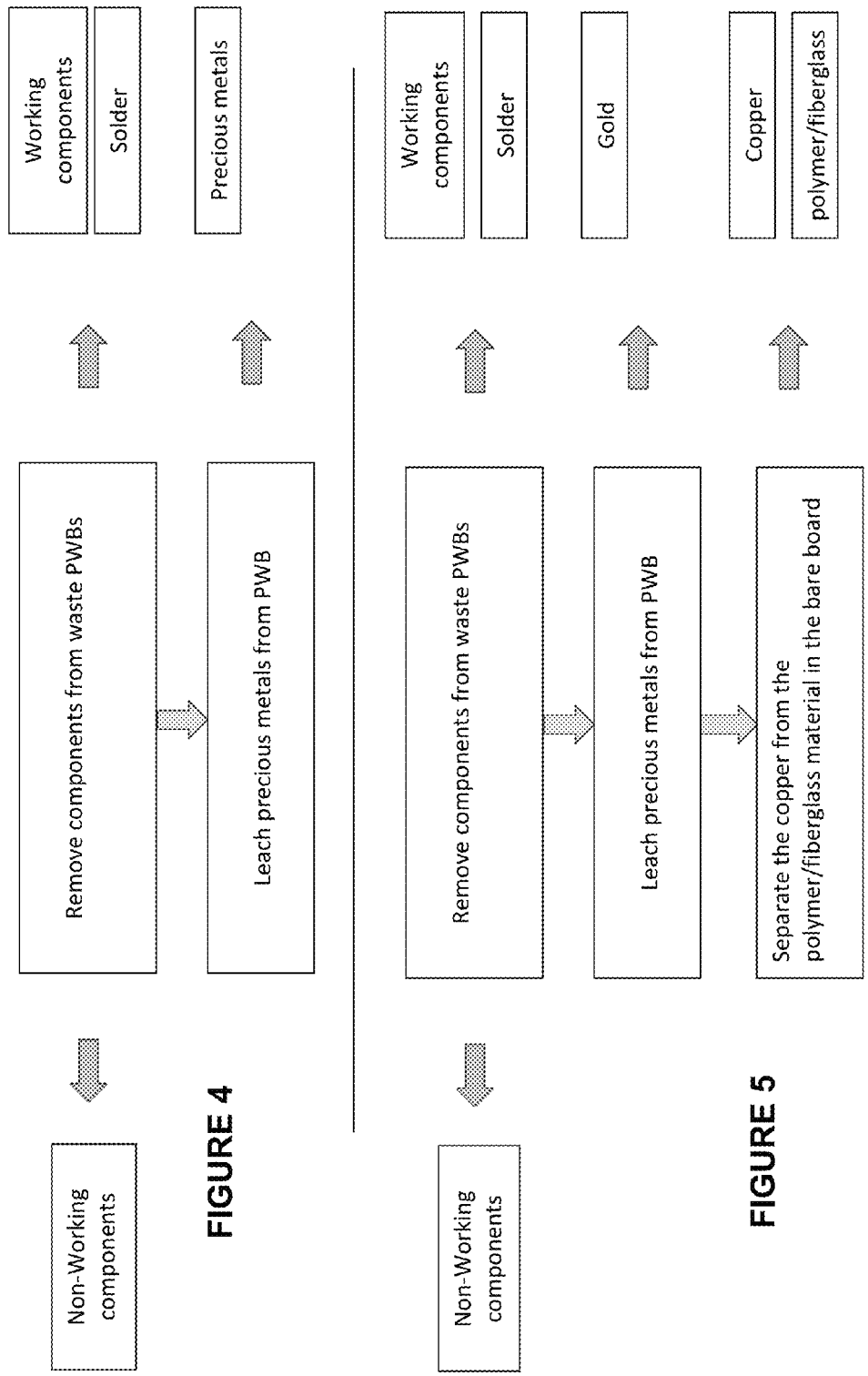
FIG. 4 illustrates a fourth embodiment of the method of recycling printed wire boards.
FIG. 5 illustrates a fifth embodiment of the method of recycling printed wire boards.

A fourth embodiment of eighth aspect corresponds to a process of removing at least one component from a surface, e.g., a PWB, as generalized in FIG. 4, said method comprising:
(a) the method of the first aspect; and
(b) a method of the fifth aspect,
or
(a) removing solder from the surface, wherein the removal of solder releases at least one component from the surface; and
(b) leaching precious metals from said surface and/or said at least one component,
or
(a) removing solder from the surface, wherein the removal of solder releases at least one component from the surface; and
(b) introducing the surface and/or at least one component to a leaching composition in a vessel, and optionally producing ultrasonic cavitation or other agitation means in said vessel, wherein said leaching composition comprises triiodide, to substantially remove precious metals from said surface and/or said at least one component,
or
(a) contacting solder with a first composition in a vessel, and optionally producing ultrasonic cavitation or other agitation means in said vessel, to selectively remove the solder relative to precious metals, tantalum-containing metals, and/or base metals that are simultaneously present on said surface, wherein the removal of solder releases at least one component from the surface; and (b) leaching precious metals from said surface and/or said at least one component, or (a) contacting solder with a first composition in a vessel, and optionally producing ultrasonic cavitation or other agitation means in said vessel, to selectively remove the solder relative to precious metals, tantalum-containing metals, and/or base metals that are simultaneously present on said surface, wherein the removal of solder releases at least one component from the surface; and (b) introducing the surface and/or said at least one component to a leaching composition in a vessel, and optionally producing ultrasonic cavitation or other agitation means in said vessel, wherein said leaching composition comprises triiodide, to substantially remove precious metals from said surface and/or said at least one component.

A fifth embodiment of seventh aspect corresponds to a process of removing at least one component from a surface, e.g., a PWB, as generalized in FIG. 5, said method comprising:

(a) the method of the first aspect;
(b) the method of the fifth aspect; and
(c) the method of the sixth aspect, or (a) removing solder from the surface, wherein the removal of solder releases at least one component from the surface;
(b) leaching precious metals from said surface to yield a bare board comprising fiberglass layer and copper; and
(c) separating the fiberglass layer and copper of the bare board, or (a) removing solder from the surface, wherein the removal of solder releases at least one component from the surface;
(b) introducing the surface to a leaching composition in a vessel, and optionally producing ultrasonic cavitation or other agitation means in said vessel, wherein said leaching composition comprises triiodide, to substantially remove precious metals from said surface, to yield a bare board comprising fiberglass layer and copper; and
(c) separating the fiberglass layer and copper of the bare board, or (a) contacting solder with a first composition in a vessel, and optionally producing ultrasonic cavitation or other agitation means in said vessel, to selectively remove the solder relative to precious metals, tantalum-containing metals, and/or base metals that are simultaneously present on said surface, wherein the removal of solder releases at least one component from the surface;
(b) leaching precious metals from said surface to yield a bare board comprising fiberglass layer and copper; and
(c) separating the fiberglass layer and copper of the bare board, or (a) contacting solder with a first composition in a vessel, and optionally producing ultrasonic cavitation or other agitation means in said vessel, to selectively remove the solder relative to precious metals, tantalum-containing metals, and/or base metals that are simultaneously present on said surface, wherein the removal of solder releases at least one component from the surface;

(b) introducing the surface to a leaching composition in a vessel, and optionally producing ultrasonic cavitation or other agitation means in said vessel, wherein said leaching composition comprises triiodide, to substantially remove precious metals from said surface, to yield a bare board comprising fiberglass layer and copper; and
(c) separating the fiberglass layer and copper of the bare board.

Regardless of which embodiment of the seventh aspect is used, consistent with the disclosures herein, the solder can comprise lead, tin, or a combination of lead and tin. Preferably, the surface includes a PWB and the recyclable material comprises components (e.g., ICs), precious metals, base metals, or any combination of components, precious metals and base metals. The released components can be collected and can be separated into those that are reusable and can be resold and those that can be further processed for disposal, reclamation of useful materials, etc. The first composition preferably selectively removes solder (e.g., lead, tin, alloys thereof, and combinations thereof) relative to precious metals, tantalum-containing metals, and/or base metals, and the components that are liberated following removal of the solder are readily collected and sorted for reuse or reclamation purposes. The second composition preferably etchingly removes the base metals such as copper and/or nickel and undercuts the precious metals (e.g., gold), wherein the precious metals delaminate from the surface and is readily collected (e.g., by filtering). Subsequent to solder removal, the first composition, which includes lead and/or tin ions, can be subjected to further processing (e.g., electrowinning) to reclaim the lead and/or tin. Subsequent to base metal removal, the second composition comprising the base metal ions can be processed to obtain useful forms of said base metals (e.g., electrochemically or by electrowinning). Methods of separating the fiberglass and copper of the bare board are disclosed in the sixth aspect herein. Preferably, prior to introducing the at least one PWB component or the surface to the leaching composition, the at least one PWB component or surface is crushed. Subsequent to leaching, the gold can be precipitated as described herein. Although not wishing to be bound by theory, it is thought that the ultrasonics or other agitation means in the presence of the first, second and/or leaching compositions enhance the selective leaching of the materials to be removed. Ultrasonics or other agitation means may be applied exclusively in the presence of the first composition, exclusively in the presence of the second composition, exclusively in the presence of the leaching composition, any combination of the three, or not at all. It should be appreciated by the skilled artisan that the compositions of the second and fourth aspect described herein represent just one version of the first and second compositions, respectively, of the seventh aspect. Other first and second compositions are contemplated for use in the process of the seventh aspect, as readily determined by one skilled in the art. It should be appreciated that rinsing and/or drying steps are contemplated following the contact of the first, second and/or leaching compositions with the PWB. The conditions of contact (i.e., time and temperature) were introduced herein. Advantageously, the method allows a user to take obsolete and used printed wire boards and recycle the electronic components and metals contained thereon for reuse.

An eighth aspect relates to a kit including, in one or more containers, one or more species adapted to form the compositions described herein.

In a ninth aspect, a method of removing lead and/or tin-containing materials from a solid material is described, wherein said method includes contacting the first composition with the solid material having the lead and/or tin-containing materials thereon or therein, under sufficient contacting conditions to remove the lead and/or tin-containing materials from the solid material. The solid material includes, but is not limited to, microelectronic devices, metals, plastics, fabrics, fibers, soils, ores, wood, paper, glass, leather and other animal hides, cement, concrete, bricks, drywall, asphalt, keratin-containing substances such as hair and nails, rubber, latex, and combinations thereof. For example, in one embodiment, lead and/or tin-containing materials may be removed from soil to remediate same.

In a tenth aspect, a method of removing copper and/or nickel-containing materials from a solid material is described, wherein said method includes contacting the second composition with the solid material having the copper and/or nickel-containing materials thereon or therein, under sufficient contacting conditions to remove the copper and/or nickel-containing materials from the solid material. The solid material includes, but is not limited to, microelectronic devices, metals, plastics, fabrics, fibers, soils, ores, wood, paper, glass, leather and other animal hides, cement, concrete, bricks, drywall, asphalt, keratin-containing substances such as hair and nails, rubber, latex, and combinations thereof. For example, in one embodiment, lead and/or tin-containing materials may be removed from ores containing same.

Advantageously, the methods and compositions described herein provide environmentally-friendly solutions to recycling printed wire boards, with high percentages of the recyclable materials able to be reclaimed for reuse.

The features and advantages of the invention are more fully shown by the illustrative examples discussed below.

Example 1

Three compositions were prepared, a 1:1 v/v HEDP/30 wt % $H_2O_2$ solution (formulation A), a 1:1 v/v EDDS/30 wt % $H_2O_2$ solution (formulation B), and a 1:1 v/v HEIDA/30 wt % $H_2O_2$ solution (formulation C). Approximately 0.3 g of copper wire, nickel foil, granular tin, lead foil, aluminum wire, iron powder and granular zinc were individually and statically immersed in clean formulations A-C at 40° C. for 30 minutes. Following removal of the remaining solids, the solutions were subjected to inductively coupled plasma (ICP) analysis to determine the concentration of each metal (in ppm) in each solution. The results are summarized in Tables 1-3.

TABLE 1

Results following immersion of materials in Formulation A.

| Chemistry | Sample to be Tested | pH | Al/ ppm | Cu/ ppm | Fe/ ppm | Ni/ ppm | Pb/ ppm | Sn/ ppm | Zn/ ppm |
|---|---|---|---|---|---|---|---|---|---|
| HEDP/$H_2O_2$ | NA | 1 | ND | 1.81 | 0.07 | 0.16 | ND | 0.16 | 0.28 |
| HEDP/$H_2O_2$ | Copper wire | 1 | 0.43 | 14770 | 30.11 | 0.38 | 4.23 | 1.96 | 39.93 |
| HEDP/$H_2O_2$ | Nickel Foil | 1 | 0.3 | 3.1 | 0.08 | 10.45 | ND | ND | 0.26 |
| HEDP/$H_2O_2$ | Tin Granular | 1 | 0.11 | 1.44 | 0.17 | 0.12 | ND | ND | 0.19 |
| HEDP/$H_2O_2$ | Lead Foil | 1 | 0.66 | 3.19 | 0.11 | 0.13 | 56.8 | ND | 0.23 |
| HEDP/$H_2O_2$ | Al wire | 1 | 12.2 | 2.09 | 0.14 | ND | ND | ND | 0.19 |
| HEDP/$H_2O_2$ | Fe powder | 1 | 0.12 | 5.44 | 7439 | 0.15 | ND | ND | 2.16 |
| HEDP/$H_2O_2$ | Zn granular | 1 | ND | 2.54 | 0.08 | 0.09 | ND | ND | 0.17 |

TABLE 2

Results following immersion of materials in Formulation B.

| Chemistry | Sample to be Tested | pH | Al/ ppm | Cu/ ppm | Fe/ ppm | Ni/ ppm | Pb/ ppm | Sn/ ppm | Zn/ ppm |
|---|---|---|---|---|---|---|---|---|---|
| HEIDA/$H_2O_2$ | Copper wire | 2 | ND | 1231 | ND | ND | 1.89 | ND | 3.5 |
| HEIDA/$H_2O_2$ | Nickel Foil | 2 | ND | 2.06 | 0.16 | 0.34 | 3.07 | ND | 0.07 |
| HEIDA/$H_2O_2$ | Tin Granular | 2 | ND | ND | ND | ND | 0.52 | ND | 0.07 |
| HEIDA/$H_2O_2$ | Lead Foil | 2 | ND | 1.65 | ND | ND | 7320 | ND | 0.09 |
| HEIDA/$H_2O_2$ | Al wire | 2 | ND | 2.54 | 0.1 | ND | ND | ND | 0.02 |
| HEIDA/$H_2O_2$ | Fe powder | 2 | ND | ND | 1.5 | ND | ND | ND | 615 |
| HEIDA/$H_2O_2$ | Zn granular | 2 | ND | 6.44 | ND | ND | ND | ND | 0.01 |

TABLE 3

Results following immersion of materials in Formulation C.

| Chemistry | Sample to be Tested | pH | Al/ ppm | Cu/ ppm | Fe/ ppm | Ni/ ppm | Pb/ ppm | Sn/ ppm | Zn/ ppm |
|---|---|---|---|---|---|---|---|---|---|
| EDDS/$H_2O_2$ | copper wire | 6 | ND | 157 | 1.86 | 0.12 | ND | 0.18 | 0.47 |
| EDDS/$H_2O_2$ | Nickel Foil | 6 | ND | ND | 1.38 | 0.15 | ND | ND | 0.09 |
| EDDS/$H_2O_2$ | Tin Granular | 6 | ND | 0.58 | 1.62 | 5.62 | 0.33 | 0.25 | 0.16 |
| EDDS/$H_2O_2$ | Lead Foil | 6 | ND | ND | 0.21 | ND | 1565 | ND | 0.13 |
| EDDS/$H_2O_2$ | Al wire | 6 | 1.32 | ND | 0.98 | ND | 0.07 | 0.28 | 0.21 |
| EDDS/$H_2O_2$ | Fe powder | 6 | 0.09 | 0.16 | 8.47 | ND | ND | 0.97 | 215 |
| EDDS/$H_2O_2$ | Zn granular | 6 | ND | ND | 0.25 | ND | ND | 0.16 | 0.09 |

It can be seen that the compositions comprising HEIDA or EDDS are especially useful for removing lead relative to copper and other precious metals, especially if the user optionally considers including a copper passivating agent in both compositions.

Example 2

Compositions were prepared as described in Table 4 below. Copper wire, lead foil, granular tin, nickel foil, aluminum wire, iron powder and granular zinc were individually and statically immersed in each formulations at 40° C. for 30 minutes. Following removal of the remaining solids, the solutions were subjected to inductively coupled plasma (ICP) analysis to determine the concentration of each metal (in ppm) in each solution. The results are summarized in Table 4.

TABLE 4

Results following immersion of materials in the listed compositions.

| Chemistry | Al/ppm | Cu/ppm | Fe/ppm | Ni/ppm | Pb/ppm | Sn/ppm | Zn/ppm |
|---|---|---|---|---|---|---|---|
| First composition (remove Pb/Sn selectively) | | | | | | | |
| MSA | 4940 | ND | 109300 | 1861 | 1040 | 2453 | 236 |
| MSA + 1 wt % butyl carbitol (BC) | 45 | ND | 1531000 | 74 | 52200 | 4217 | 3324 |
| MSA + 1 wt % BC + 0.3 wt % sodium molybdate dihydrate | 69.6 | 24.8 | 63920 | 8.4 | 23720 | 13840 | 293.6 |
| MSA + 1 wt % BC + 0.3 wt % suberic acid | ND | ND | 794400 | 21.6 | 16400 | 2420 | 625.2 |
| Second composition (remove Cu/Ni selectively) | | | | | | | |
| oxone (10 wt % in water) | 56.8 | 3030 | 15560 | 0.8 | 2.1 | ND | 9630 |
| oxone (10 wt % in water) + 0.3 wt % suberic acid | 67.46 | 7220 | 1574.6 | 24.6 | 4.6 | ND | 17500 |
| oxone (10 wt % in water) + 0.3 wt % sodium molybdate dihydrate | 70.6 | 9820 | 217 | 30.8 | ND | 53.6 | 5240 |
| oxone (10 wt % in water) + 0.3 wt % sodium hexametaphosphate | 22.8 | 14040 | 1420 | 20.6 | ND | ND | 17500 |
| potassium persulfate (5 wt % in water) | 14 | 215.9 | 64500 | 4.4 | 3.3 | ND | 5420 |
| 5 wt % ammonium persulfate | 24.6 | 374 | 96480 | 13.8 | 277.6 | ND | 14560 |
| 30 wt % ammonium persulfate | 102.2 | 11360 | 202600 | 24.4 | 293.4 | ND | 49620 |

Surprisingly, when butyl carbitol and sodium molybdate was added to MSA to produce the first composition, the etch rates of Pb and Sn significantly increased while the etch rates of Al, Fe, Ni and Zn significantly decreased. Accordingly, the first composition including MSA, butyl carbitol and sodium molybdate dihydrate will be useful for the selective removal of Pb/Sn containing solder relative to precious metals and/or copper.

When sodium molybdate or sodium hexametaphosphate were added to oxone to produce the second composition, the etch rates of Cu increased significantly while the etch rates of Fe decreased significantly. Accordingly, the second composition including oxone and sodium molybdate or sodium hexametaphosphate will be useful for the selective removal of Cu relative to other metals.

Example 3

An aqueous first composition was prepared, containing 250 mL of 70% methane sulfonic acid and 250 mL of deionized (DI) water. A waste video card NVIDIA model P118 was immersed in the first composition in silent leaching mode. The mounted components were detached in 4 days, gold plating was not affected, some pins on the detached components corroded, sludge and gas formation were not detected. The same solution was irradiated by ultrasound during 30 minutes but gave no noticeable result in detaching components.

An imitation of commercially available nitric acid based solder stripping solution was prepared, containing 145 mL of 70% nitric acid, 30 g of ammonium sulfamate, 1 g of benzotriazole and 40 g of ferric nitrate nonahydrate, balanced by DI water to 500 mL of total volume. A video card was subjected to silent leaching in this solution. The components detached in 20 minutes, the solution became green and a piece of steel, which is part of the video card, almost completely dissolved, which proves that commercially available solder solutions cannot be used to achieve the goals of the present invention.

A first composition containing 200 mL of 70% MSA, 50 mL of 70% nitric acid, 30 g of ammonium sulfamate and 1 g of benzotriazole, balanced by DI water to 500 mL of total volume was prepared and a video card was immersed in the first composition in silent leaching mode. The components started to detach in 45 minutes, all the components were detached in one hour. No sludge and gas formation was noticed, gold plating was not affected, and the components' pins were not damaged by corrosion.

A first composition containing 200 mL of 70% MSA, 50 mL of 70% nitric acid, 8 g of ammonium sulfamate, 1 g of benzotriazole and balanced by DI water to the volume of 500 mL was prepared. The first composition was poured into a 750-mL leaching container, a video card was immersed in the solution and the container was closed with a cover, which had an opening left for the ultrasonic horn to be inserted. A 1000 W ultrasonic processor with operational frequency 20 kHz, frontal area of 9.0 cm$^2$ and amplitude ratio approx. 1:2.4 was used to create ultrasonic irradiation (UIP1000hd manufactured by Hielscher Ultrasonics GmbH). A mechanical amplitude booster was used for amplitude increase with ratio 1:1.8. The combination of such a sonotrode with such a booster provided the maximal amplitude of 35 μm at 100% amplitude setting. The ultrasonic horn was immersed in the first composition and was positioned in such a way so as not to touch the surface of the board or the components. The application of ultrasound irradiation created strong cavitation in the volume of first composition, visible as intense cavitation bubbles. After six minutes of sonication with amplitude of 100%, some components detached from the surface of the board; after two additional minutes all the components detached. No sludge or gas formation was noticed, gold plating was not affected, and components' pins were not damaged by corrosion. The same results were obtained with a RAM stick, model 128 Mbytes from SEC and a network card from 3Com model 920-ST03.

Example 4

Compositions A and B were formulated.
Composition A: 10 g KI, 2.5 g sodium persulfate, 25 mL water
Composition B: 10 g KI, 2.5 g ammonium persulfate, 25 mL water Printed wire boards (less than 2 cm×2 cm) coated with about 0.05%~0.5% gold were immersed in Compositions A and B at room temperature and the extent of gold dissolution monitored at 4 minutes, 10 minutes and 30 minutes using Inductively Coupled Plasma (ICP-OES) spectroscopy. In composition A, 80% of the gold was dissolved within 4 min, and 99% within 10 min. In composition B, 90% of the gold was dissolved within 4 min, and 100% within 10 min.

Example 5

Compositions C-G were formulated:
Composition C, 40.08 g KI, 10.03 g $I_2$, 100 g water
Composition D: 40 g KI, 10.02 g $HNO_3$ (70%), 100 g water
Composition E: 40.08 g KI, 9.98 g $HIO_4$, 10.04 g HCl (37%), 90.08 g water
Composition F: 39.99 g KI, 10.00 g oxone, 100.04 g water
Composition G: 40.10 g KI, 9.99 g NaOCl, 10.06 g HCl (37%), 89.96 g water Compositions C-G are all deep red after mixing, with compositions E and F having some precipitate in the container. Printed wire boards (less than 2 cm×2 cm) coated with about 0.05%~0.5% gold were immersed in approximately 50 g of Compositions C-G (a) in a water bath maintained at 39° C. for 30 min. The results are tabulated in Table 5.

TABLE 5

Extent of Au dissolution in Compositions C-G.

| Formulation | water bath results |
|---|---|
| C | 10 min, 70% Au dissolved |
|   | 20 min, 100% Au dissolved |
| D | 10 min, no change |
|   | 20 min, no change |
|   | 30 min, no change |
| E | 10 min, 100% Au dissolved |
| F | 10 min, 75% Au dissolved |
|   | ~15 min, 100% Au dissolved |
| G | 10 min, 5% Au dissolved |
|   | 20 min, 50% Au dissolved |
|   | ~25 min, 85% Au dissolved |
|   | ~30 min, 100% Au dissolved |

Example 6

Leaching rate, bath loading and bath life was compared for solutions containing (a) KI, sodium persulfate, and water, (b) KI, ammonium persulfate, and water, and (c) KI, oxone, and water, wherein the amounts of iodide salt, oxidizing agent and water in each solution are the same. Printed wire boards (less than 2 cm×2 cm) coated with about 0.05%~0.5% gold were immersed in each composition at room temperature and the extent of gold dissolution monitored at 30 minutes using ICP-OES. Loading results are shown in Table 6 for several metals.

TABLE 6

Metals loading in compositions at room temperature.

| Metal | KI, sodium persulfate, and water | KI, ammonium persulfate, and water | KI, oxone, and water |
|---|---|---|---|
|  | | µg/mL | |
| Ag | 0.14 | 0.09 | 0.42 |
| Al |  | 0.092 |  |
| Au | 281.42 | 250.47 | 214.44 |
| Co | 0.031 | 0.02 | 0.013 |
| Cu | 19.3 | 23.15 | 28.2 |
| Fe |  | 0.15 |  |
| Ni | 10.89 | 9.64 | 15.07 |
| Pb | 3.3 | 3.06 | 2.21 |
| Sn | 0.37 | 0.33 | 0.44 |
| Zn | 24.46 | 25.69 | 0.17 |

Further, it was concluded that the solution containing the ammonium persulfate had the least deposition formation while the solution containing the oxone had the lowest leaching rate, lowest loading, lowest bath life, and highest amount of deposition.

It was further discovered that the deposit and the PWB's can be rinsed and the rinse water collected to maximize the recovery of gold from the solution.

Example 7

Printed wire board pieces were immersed in Composition F at room temperature and 40° C. and the extent of metal dissolution monitored at intervals using ICP-OES. Each sample was diluted 50 times with water prior to analysis. The results are tabulated in Table 7.

TABLE 7

Metals loading in Composition F at room temperature and 40° C.

| Metal | 40° C., 50 g Composition F, 21 pieces PWB | room temperature, 36 g Composition F, 27 pieces PWB |
|---|---|---|
|  | µg/mL | |
| Ag | 0.012 | 0.014 |
| Au | 160.99 | 676.97 |
| Co | 0.008 | 0.014 |
| Cu | 4.91 | 5.39 |
| Ni | 4.38 | 9.14 |
| Pb | 0.11 | 0.088 |
| Sn |  | 0.13 |

It can be seen that the formulations are actually more effective at leaching metals at room temperature than they are at elevated temperatures.

Example 8

Pieces of bare printed circuit boards with visible gold plating and total weight of 380 g were placed in a 2-liter glass beaker, to which 1 liter of an aqueous solution of potassium iodide was added (72.5 g of solid potassium iodide per 100 mL of de-ionized water). The experiment was held at the ambient temperature of 21° C. The sonotrode of the ultrasound device UIP1000hd (20 kHz, 1000 W, manufactured by Hielscher Ultrasonics GmbH) was placed into the beaker and was positioned in such a way to be immersed in the solution and not to touch the PWBs. The ultrasonic device was operated with the ultrasonic frequency of 20 kHz and amplitude of 25 microns for 2 minutes, after which the ultrasonic horn was removed from the beaker. The application of ultrasound irradiation to the solution volume created strong cavitation, visible as intense cavitation bubbles formed in the volume of the liquid. The solution changed its color from clear to tea-brown, which indicated formation of tri-iodide ions. 1 mL of 70% nitric acid was added to the solution. No visible remaining gold plating was detected by visual inspection on the surface of treated boards; at the same time the base metals were not affected. The pieces of boards were removed from the beaker, and the solution was filtered through an 1810 Whatman Acid-Treated Low Metal TCLP filter to remove any solid impurities. The pregnant solution was then mixed with a saturated aqueous solution of sodium bisulfite and stirred with a mechanical mixer for 30 minutes. The solution changed its color to clear yellow, and a fine brown powder of metallic gold precipitated. The powder was filtered off, rinsed with deionized water and dried. Separate analysis of the recovered precipitate showed 99.2±0.2% gold. The precipitate was heated in a porcelain crucible at 1200° C. whereby a metallic gold button was formed.

The analysis of liquid showed 2 ppm gold in the spent solution. To restore the leaching solution, it was oxidized back to its original strength by the slow addition of 30% hydrogen peroxide with stirring until the solution regained its tea-brown color.

The processed PWBs were rinsed with 500 mL of water and dried. The rinse water containing low concentration of tri-iodide solution was treated with an excess of the saturated solution of potassium persulfate, whereby the crystal iodine appeared in the volume of the liquid as black powder precipitate and the rinse water lost its slight tea-color, becoming colorless. The iodine was separated from the solution and dissolved in the regenerated leaching solution.

Example 9

200 g of a "red metals" concentrate, which was created as a result of mechanical recycling of waste electronic equipment, was treated with the same leaching composition as described in Example 8, buffered with potassium dihydrogen phosphate/sodium hydroxide to pH=5.6. The concentrate represents an output material of a shredding and grinding operation applied to mixed electronic waste, followed by magnetic and eddy-current separation and concentration on shaker tables. The composition of the initial metallic mixture with particle size 0.4-1 mm is shown in Table 8.

TABLE 8

| Composition of non-treated concentrate measured in "Electronic Alloys" mode with Niton XL3t GOLDD XRF-Analyzer manufactured by Thermo Fisher Scientific Inc. | | | | | | | | |
|---|---|---|---|---|---|---|---|---|
| element | Ag | Au | Pt | Pb | Zn | Cu | Fe | Sn | others |
| % | 0.158 | 1.564 | 0.395 | 15.615 | 10.794 | 52.766 | 6.015 | 9.813 | 2.880 |

The "red metals" concentrate was brought in contact with 1 liter of leaching composition in a 2-liter beaker under ultrasonic irradiation of 20 kHz leaching solution and amplitude of 25 microns for 2 minutes. The metallic mixture was separated from the pregnant leach liqueur by filtering, washed with deionized water and dried. Measurement of the concentration of metals in the treated sample showed non-detectable levels of Ag, Au, Pt and Pd.

The precious metals in the filtrate were recovered by dripping 10 mL of stabilized sodium borohydride (4.4 M in 14M NaOH) into the leach liqueur and stirring, whereby the powdered precipitate of precious metals appeared in the solution. 30 mL of MAGNAFLOC-351 flocculating agent was added to the liquid-solid mixture, and the powdered particles adhered to the granules. The liquid was filtered and the precipitate of mixed precious metals was recovered, washed and dried. The precipitate was heated in the inductive furnace to 1850° C., forming an alloy of precious metals. The leaching solution was brought back to its original strength by dripping 30% hydrogen peroxide into the solution until the tea-brown color of the solution was restored.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A method of recovering at least one precious metal from a printed wire board (PWB) comprising solder and at least one precious metal, said method comprising:
 (a) contacting a surface of the PWB with a first composition, wherein the PWB and the first composition are in a first vessel;
 (b) agitating said first vessel;
 (c) dissolving or solubilizing the solder in the first composition, wherein the first composition selectively removes the solder relative to the at least one precious metal;
 (d) removing the first composition from the PWB by rinsing;
 (e) drying the PWB;
 (f) contacting the PWB with a leaching composition, wherein the PWB and the leaching composition are in a second vessel;
 (g) producing agitation in said second vessel;
 (h) dissolving or solubilizing the at least one precious metal in the leaching composition;
 (i) removing the leaching composition from the PWB by rinsing; and
 (j) recovering the at least one precious metal from the leaching composition,
 wherein the first composition is substantially devoid of at least one of fluoride salts, ferric salts, titanium (IV) salts, abrasive material, fluoroboric acid, and ferric nitrate.

2. The method of claim 1, wherein at least one component is attached to a surface of the PWB, and the at least one component is separated from the PWB during dissolution or solubilization in the first composition, wherein said at least one component is selected from the group consisting of transistors, capacitors, heat sinks, integrated circuits, resistors, integrated switches, chips, processors, and combinations thereof.

3. The method of claim 2, wherein at least one precious metal is removed from the at least one component using the leaching composition.

4. The method of claim 3, further comprising the step of crushing the PWB component prior to contact with the leaching composition.

5. The method of claim 2, wherein the at least one component is reusable or recyclable and are separated accordingly.

6. The method of claim 1, wherein the solder comprises lead, tin or a lead/tin alloy.

7. The method of claim 1, wherein the first composition comprises at least one oxidizing agent, and at least one passivating agent for passivating precious metals.

8. The method of claim 7, wherein the at least one oxidizing agent comprises nitric acid, ozone, bubbled air, cyclohexylaminosulfonic acid, hydrogen peroxide, oxone, ammonium peroxomonosulfate, ammonium chlorite, ammonium chlorate, ammonium iodate, ammonium perborate, ammonium perchlorate, ammonium periodate, ammonium persulfate, ammonium hypochlorite, sodium persulfate, sodium hypochlorite, potassium iodate, potassium permanganate, potassium persulfate, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, urea hydrogen peroxide, peracetic acid, sodium nitrate, potassium nitrate, ammonium nitrate, benzene sulfonic acid derivatives, methanesulfonic acid (MSA), ethanesulfonic acid, 2-hydroxyethanesulfonic acid, n-propanesulfonic acid, isopropanesulfonic acid, isobutenesulfonic acid, n-butanesulfonic acid, n-octanesulfonic acid), benzenesulfonic acid, benzenesulfonic acid derivatives (e.g., 4-methoxybenzenesulfonic acid, 4-hydroxybenzenesulfonic acid, 4-aminobenzenesulfonic acid, 4-nitrobenzenesulfonic acid, toluenesulfonic acid, hexylbenzenesulfonic acid, heptylbenzenesulfonic acid, octylbenzenesulfonic acid, nonylbenzenesulfonic acid, decylbenzenesulfonic acid, undecylbenzenesulfonic acid, dodecylbenzenesulfonic acid, tridecylbenzenesulfonic acid, tetradecylbenzene sulfonic acid, hexadecylbenzene sulfonic acid, 3-nitrobenzenesulfonic acid, 2-nitrobenzenesulfonic acid, 2-nitronaphthalenesulfonic acid, 3-nitronaphthalenesulfonic acid, 2,3-dinitrobenzenesulfonic acid, 2,4-dinitrobenzenesulfonic acid, 2,5-dinitrobenzenesulfonic acid, 2,6-dinitrobenzenesulfonic acid, 3,5-dinitrobenzenesulfonic acid, 2,4,6-trinitrobenzenesulfonic acid, 3-aminobenzenesulfonic acid, 2-aminobenzenesulfonic acid, 2-aminonaphthalenesulfonic acid, 3-aminonaphthalenesulfonic acid, 2,3-diaminobenzenesulfonic acid, 2,4-diaminobenzenesulfonic acid, 2,5-diaminobenzenesulfonic acid, 2,6-diaminobenzenesulfonic acid, 3,5-diaminobenzenesulfonic acid, 2,4,6-triaminobenzenesulfonic acid, 3-hydroxybenzenesulfonic acid, 2-hydroxybenzenesulfonic acid, 2-hydroxynaphthalenesulfonic acid, 3-hydroxynaphthalenesulfonic acid, 2,3-dihydroxybenzenesulfonic acid, 2,4-dihydroxybenzenesulfonic acid, 2,5-dihydroxybenzenesulfonic acid, 2,6-dihydroxybenzenesulfonic acid, 3,5-dihydroxybenzenesulfonic acid, 2,3,4-trihydroxybenzenesulfonic acid, 2,3,5-trihydroxybenzenesulfonic acid, 2,3,6-trihydroxybenzenesulfonic acid, 2,4,5-trihydroxybenzenesulfonic acid, 2,4,6-trihydroxybenzenesulfonic acid, 3,4,5-trihydroxybenzenesulfonic acid, 2,3,4,5-tetrahydroxybenzenesulfonic acid, 2,3,4,6-tetrahydroxybenzenesulfonic acid, 2,3,5,6-tetrahydroxybenzenesulfonic acid, 2,4,5,6-tetrahydroxybenzenesulfonic acid, 3-methoxybenzenesulfonic acid, 2-methoxybenzenesulfonic acid, 2,3-dimethoxybenzenesulfonic acid, 2,4-dimethoxybenzenesulfonic acid, 2,5-dimethoxybenzenesulfonic acid, 2,6-dimethoxybenzenesulfonic acid, 3,5-dimethoxybenzenesulfonic acid, 2,4,6-trimethoxybenzenesulfonic acid, and combinations thereof.

9. The method of claim 7, wherein the at least one oxidizing agent comprises an alkanesulfonic acid selected from the group consisting of methanesulfonic acid, ethanesulfonic acid, 2-hydroxyethanesulfonic acid, n-propanesulfonic acid, isopropanesulfonic acid, isobutenesulfonic acid, n-butanesulfonic acid, and n-octanesulfonic acid.

10. The method of claim 7, wherein the at least one passivating agent comprises a triazole derivative selected from the group consisting of 1,2,4-triazole, benzotriazole, tolyltriazole, 5-phenyl-benzotriazole, 5-nitro-benzotriazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles, naphthotriazole, 4-methyl-4H-1,2,4-triazole-3-thiol, and 3-amino-5-mercapto-1,2,4-triazole.

11. The method of claim 7, wherein the first composition further comprises at least one complexing agent and/or at least one organic solvent.

12. The method of claim 7, wherein the first composition is substantially devoid of organic solvents including ethylene groups.

13. The method of claim 1, further comprising dissolving at least one base metal using a second composition that selectively dissolves base metal relative to precious metal.

14. The method of claim 13, wherein the base metal comprises nickel, copper, or combinations thereof.

15. The method of claim 13, wherein the second composition comprises at least one oxidizing agent, optionally at least one base metal complexing agent, optionally at least one organic solvent, and optionally at least one passivating agent for passivating precious metals.

16. The method of claim 15, comprising the at least one base metal complexing agent, wherein the at least one complexing agent comprises a species selected from the group consisting of ammonium chloride, sodium chloride, lithium chloride, potassium chloride, ammonium sulfate, hydrochloric acid, sulfuric acid, and combinations thereof.

17. The method of claim 15, wherein the at least one oxidizing agent comprises a species selected from the group consisting of an alkanesulfonic acid, ozone, nitric acid, bubbled air, cyclohexylaminosulfonic acid, hydrogen peroxide, oxone, ammonium peroxomonosulfate, ammonium chlorite, ammonium chlorate, ammonium iodate, ammonium perborate, ammonium perchlorate, ammonium periodate, ammonium persulfate, ammonium hypochlorite, sodium persulfate, sodium hypochlorite, potassium iodate, potassium permanganate, potassium persulfate, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, urea hydrogen peroxide, peracetic acid, sodium nitrate, potassium nitrate, ammonium nitrate, benzene sulfonic acid derivatives.

18. The method of claim 1, wherein the precious metal comprises gold.

19. The method of claim 18, wherein the leaching composition is substantially devoid of aqua regia and cyanide-containing components.

20. The method of claim 18, wherein the leaching composition comprises triiodide ions.

21. The method of claim 20, wherein the triiodide is generated in situ.

22. The method of claim 1, wherein the precious metal comprises gold and the gold is precipitated using a disproportionation reaction, a reducing agent, or by electrowinning.

23. The method of claim 1, wherein the PWB comprises a fiberglass layer, copper film, and adhesive.

24. The method of claim 23, wherein the adhesive is degraded to liberate the copper film from the fiberglass layer.

25. The method of claim 1, wherein the leaching composition comprises at least one oxidizing agent, at least one iodide salt or hydroiodic acid, water, and at least one metal passivating agent.

26. The method of claim 25, wherein the at least one oxidizing agent comprises a species selected from the group consisting of oxone, sodium persulfate, ammonium persulfate, potassium persulfate, nitric acid, hydrogen peroxide, ferric chloride, ferric nitrate, periodic acid, sodium hypochlorite, or combinations thereof;  and the at least one iodide salt comprises a species selected from the group consisting of lithium iodide, sodium iodide, potassium iodide, ammonium iodide, calcium iodide, magnesium iodide, and tetraalkylammonium iodides, wherein the alkyl groups may be the same as or different from one another and are selected from the group consisting of straight-chained $C_1$-$C_6$ alkyls and branched $C_1$-$C_6$ alkyls, and wherein the at least one passivating agent comprises a species selected from the group consisting 1,2,4-triazole, benzotriazole, tolyltriazole, 5-phenyl-benzotriazole, 5-nitro-benzotriazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles, naphthotriazole, 4-methyl-4H-1,2,4-triazole-3-thiol, and 3-amino-5-mercapto-1,2,4-triazole, ascorbic acid, sodium molybdate, and combinations thereof.

* * * * *